United States Patent
Bultitude et al.

(10) Patent No.: US 9,142,353 B2
(45) Date of Patent: Sep. 22, 2015

(54) DISCHARGE CAPACITOR

(71) Applicant: Kemet Electronics Corporation, Simpsonville, SC (US)

(72) Inventors: John Bultitude, Simpsonville, SC (US); Mark R. Laps, Simpsonville, SC (US); Lonnie G. Jones, Simpsonville, SC (US)

(73) Assignee: KEMET Electronics Corporation, Simpsonville, SC (US)

( * ) Notice: Subject to any disclaimer, the term of this patent is extended or adjusted under 35 U.S.C. 154(b) by 15 days.

(21) Appl. No.: 14/263,130

(22) Filed: Apr. 28, 2014

(65) Prior Publication Data
US 2014/0232485 A1    Aug. 21, 2014

Related U.S. Application Data

(63) Continuation-in-part of application No. 13/541,853, filed on Jul. 5, 2012.

(60) Provisional application No. 61/505,791, filed on Jul. 8, 2011.

(51) Int. Cl.
| | |
|---|---|
| *H01G 4/30* | (2006.01) |
| *H01G 2/14* | (2006.01) |
| *H03H 7/01* | (2006.01) |
| *H01G 4/005* | (2006.01) |
| *H01G 4/232* | (2006.01) |

(52) U.S. Cl.
CPC ............... *H01G 2/14* (2013.01); *H01G 4/005* (2013.01); *H01G 4/232* (2013.01); *H01G 4/30* (2013.01); *H03H 7/0115* (2013.01)

(58) Field of Classification Search
None
See application file for complete search history.

(56) References Cited

U.S. PATENT DOCUMENTS

| | | |
|---|---|---|
| 6,172,590 B1 | 1/2001 | Shrier et al. |
| 6,178,078 B1 | 1/2001 | Yamanishi |
| 6,819,214 B2 | 11/2004 | Elliott |
| 7,558,042 B2 | 7/2009 | Shrier |
| 7,633,735 B2 | 12/2009 | Urakawa |
| 7,733,620 B2 | 6/2010 | Yu et al. |

(Continued)

FOREIGN PATENT DOCUMENTS

| | | |
|---|---|---|
| JP | 52093946 | 8/1977 |
| JP | H09-92430 A | 4/1997 |

(Continued)

OTHER PUBLICATIONS

International Search Report for PCT/US2012/045876, prepared by ISA/KR; Jan. 30, 2013.

(Continued)

*Primary Examiner* — Dion R Ferguson
(74) *Attorney, Agent, or Firm* — Joseph T. Guy; Perkins Law Firm, LLC

(57) ABSTRACT

A discharge capacitor for use in electronic circuits is described. The discharge capacitor has first internal electrodes in electrical contact with a first external termination and second internal electrodes parallel to and interleaved with the first internal electrodes wherein the second internal electrodes are in electrical contact with a second external termination. A dielectric is between the first internal electrodes and adjacent second internal electrodes. A first discharge gap is between at least one first internal electrode of said first internal electrodes and said second external termination.

64 Claims, 21 Drawing Sheets

(56) References Cited

U.S. PATENT DOCUMENTS

| | | |
|---|---|---|
| 8,238,069 B2 | 8/2012 | Adachi et al. |
| 2004/0042141 A1 | 3/2004 | Mikolajczak et al. |
| 2006/0250744 A1 | 11/2006 | McTigue et al. |
| 2007/0081283 A1 | 4/2007 | Cheung |
| 2009/0236692 A1 | 9/2009 | Su |
| 2009/0296294 A1 | 12/2009 | Liu |
| 2011/0222203 A1 | 9/2011 | Adachi et al. |
| 2011/0227196 A1 | 9/2011 | Adachi |
| 2011/0279945 A1 | 11/2011 | Tsukizawa |
| 2011/0286142 A1 | 11/2011 | Ikeda |
| 2012/0134059 A1 | 5/2012 | Sumi et al. |
| 2012/0162838 A1 | 6/2012 | Sawada et al. |
| 2012/0169452 A1 | 7/2012 | Kiehata |

FOREIGN PATENT DOCUMENTS

| | | |
|---|---|---|
| JP | 2002270331 | 9/2002 |
| JP | 2010-15773 A | 1/2010 |
| JP | 2010-146779 | 7/2010 |
| JP | 2010146779 | 7/2010 |
| JP | 2011-28968 | 2/2011 |
| JP | 20140529094 | 7/2012 |
| WO | WO 97-26665 A1 | 7/1997 |
| WO | WO 2005/093923 | 10/2005 |
| WO | WO 2010/094795 | 8/2010 |

OTHER PUBLICATIONS

Cyrous Rostamzadeh, Electrostatic Discharge Analysis of Multi-Layer Ceramic IEEE, Jun. 6, 2009.

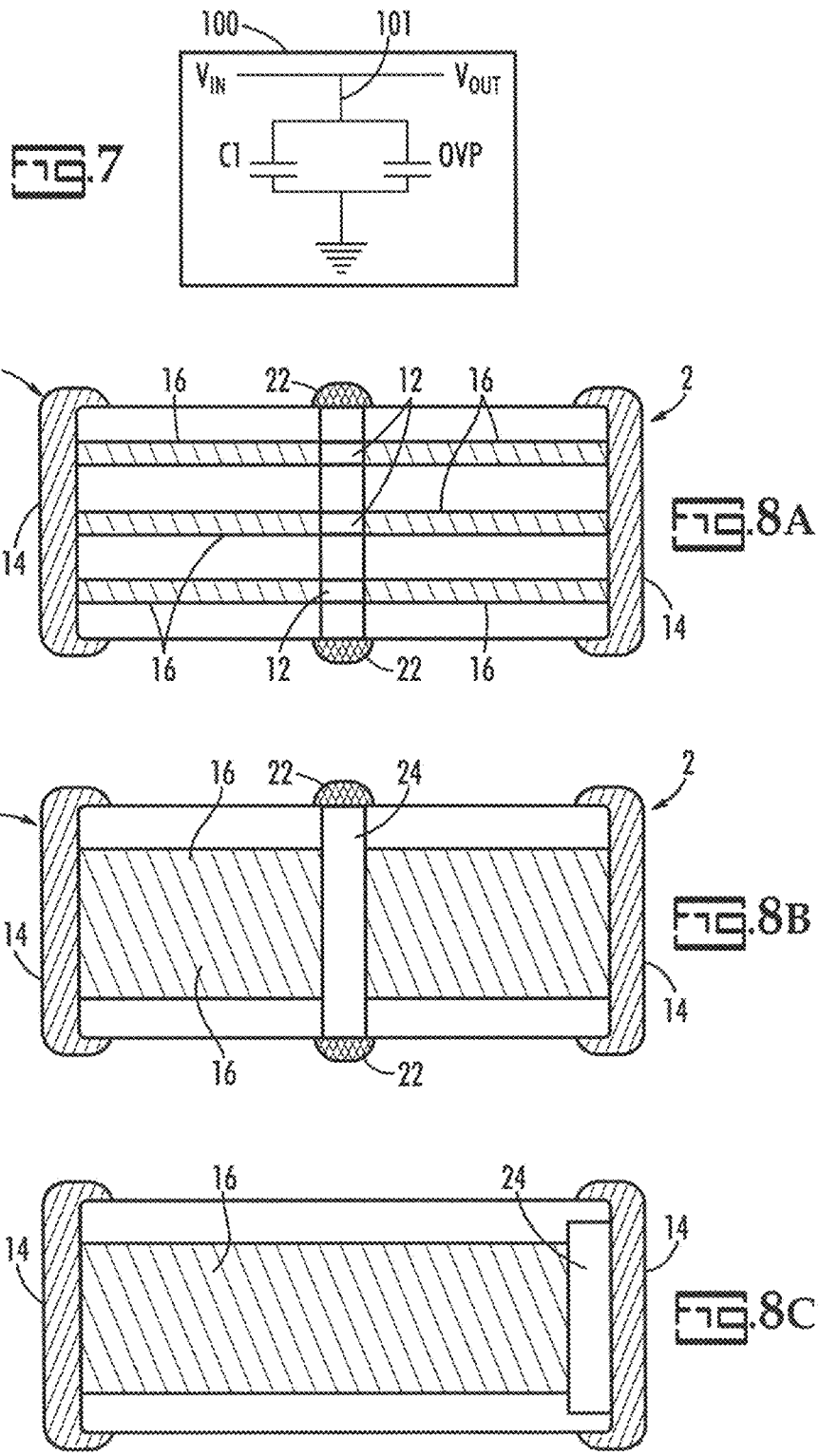

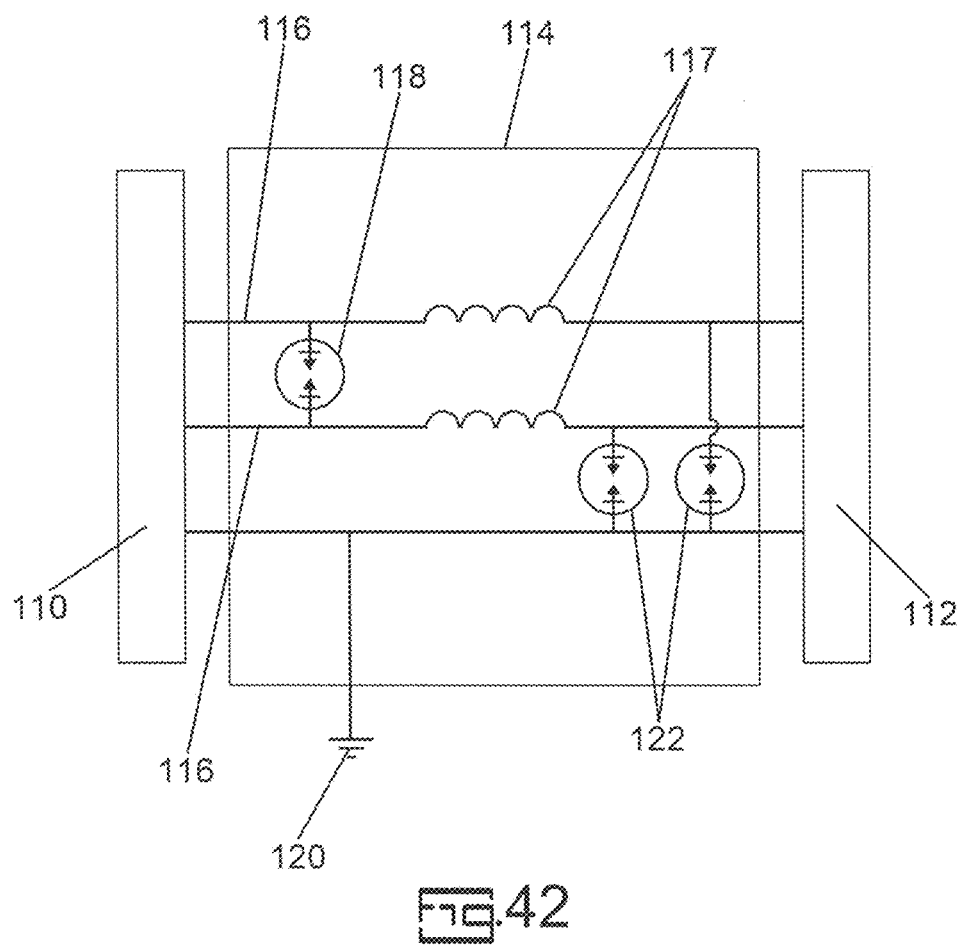

DISCHARGE CAPACITOR

CROSS-REFERENCE TO RELATED APPLICATIONS

This application is a Continuation-in-part of U.S. patent application Ser. No. 13/541,853 filed Jul. 5, 2012 which, in turn, claims priority to U.S. Provisional Patent Application No. 61/505,791 filed Jul. 8, 2011.

BACKGROUND

Overvoltage protection is typically provided by voltage dependent resistors, such as Schottky diodes based on SiC, or varistors, based on ZnO, which work on solid state principles related to grain boundary conduction.

The most popular type of voltage dependent resistors, or varistors, are based on zinc oxide doped with other elements to control the grain boundaries. These devices depend on their non-linear I-V behavior transient voltage surges. However, there are some significant compromises that result from their use. Voltage permanently applied to the varistor must be carefully limited to avoid excessive power dissipation. Since they often have a negative temperature coefficient of resistivity a runaway condition can easily be precipitated. Subjecting varistors to electric fields can change the characteristic and result in an increase in current and power dissipated as heat degrading performance.

There has been an ongoing desire for an overvoltage protection device which does not have the deficiencies of the prior art.

SUMMARY

It is an object of the present invention to provide a component that also functions as an overvoltage protection device.

It is a further object of the present invention to provide an overvoltage protection component that can be readily manufactured by similar methods currently used for multi-layer ceramic capacitors (MLCC).

A particular feature of the invention is that overvoltage protection can be realized that is surface mountable, can be produced in a miniaturized form and is suitable for large scale mass production.

It is a further object of the invention to provide a single component which functions as a discharge capacitor comprising an overvoltage protection discharge gap and capacitance in electrical series.

These and other advantages, as will be realized, are provided in an overvoltage protection component. The overvoltage protection component has a first internal electrode contained within a ceramic dielectric material. The first internal electrode is electrically connected to a first termination and a second internal electrode contained within the ceramic dielectric material is electrically connected to a second termination. A discharge gap is between the first internal electrode and the second electrode.

Yet another embodiment is provided in an improved electronic device. The electronic device has a circuit with at least two traces. An overvoltage protection is provided having a first internal electrode contained within a ceramic dielectric material and electrically connected to a first termination. A second internal electrode is contained within the ceramic dielectric material and electrically connected to a second termination. A discharge gap is between the first internal electrode and the second electrode wherein the first termination is in electrical contact with a first trace. A second termination is in electrical contact with a second trace.

Yet another embodiment is provided in a discharge capacitor. The discharge capacitor has first internal electrodes in electrical contact with a first external termination and second internal electrodes parallel to and interleaved with the first internal electrodes wherein the second internal electrodes are in electrical contact with a second external termination. A dielectric is between the first internal electrodes and adjacent second internal electrodes. A first discharge gap is between at least one first internal electrode of said first internal electrodes and said second external termination.

Yet another embodiment is provide in a discharge capacitor with first internal electrodes in electrical contact with a first external termination. Second internal electrodes are parallel to and interleaved with the first internal electrodes wherein the second internal electrodes are in electrical contact with a second external termination. A dielectric is between the first internal electrodes and adjacent second internal electrodes. A first shield electrode is in electrical contact with the first external termination and a second shield electrode is coplanar with the first shield electrode and in electrical contact with the second external termination. A shield discharge gap is between the first shield electrode and the second shield electrode.

Yet another embodiment is provided in a discharge capacitor with first internal electrodes in electrical contact with a first external termination and second internal electrodes in electrical contact with a second external termination wherein each first internal electrode is in a common plane with one second internal electrode and at least one first discharge gap is between at least one first internal electrode of the first internal electrodes and a coplanar second internal electrode of the second internal electrodes. At least one floating electrode is between adjacent common planes.

Yet another embodiment is provided in an electronic filter. The electronic filter has:
a circuit comprising at least two traces;
a discharge capacitor comprising:
first internal electrodes in electrical contact with a first external termination;
second internal electrodes parallel to and interleaved with the first internal electrodes wherein the second internal electrodes are in electrical contact with a second external termination; a dielectric between first internal electrodes and adjacent second internal electrodes;
a first discharge gap between at least one first internal electrode and a second external termination;
wherein the first termination is in electrical contact with a first trace; and
the second termination is in electrical contact with a second trace.

BRIEF DESCRIPTION OF FIGURES

FIG. 7 is a schematic view of an embodiment of the invention.

FIG. 8A is a schematic cross-sectional view of an embodiment of the invention.

FIG. 8B is a schematic cross-sectional view of an embodiment of the invention.

FIG. 8C is a schematic cross-sectional view of an embodiment of the invention.

FIG. 42 is an electrical schematic diagram of an embodiment of the invention.

DETAILED DESCRIPTION

Figure 1:
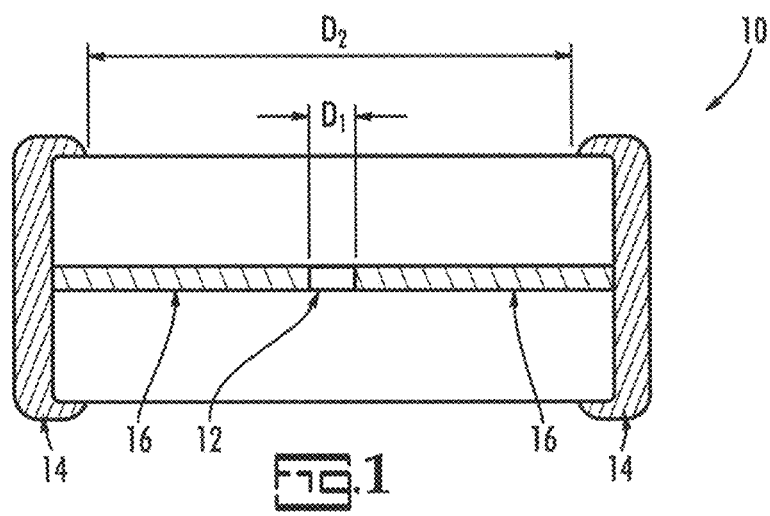
FIG. 1 is a schematic cross-sectional view of an embodiment of the invention.

The present invention is directed to overvoltage protection devices. More specifically, the present invention is related to overvoltage protection devices which can be surface mounted, manufactured using conventional manufacturing processes similar to the manufacture of multi-layered ceramic capacitors, and which have superior performance relative to prior art devices. Even more specifically, the present invention is directed to a discrete discharge capacitor capable of normal function as a capacitor with a discharge gap for overvoltage protection.

The invention will be described with reference to the figures which form an integral, non-limiting component of the instant disclosure. Throughout the description similar elements will be numbered accordingly.

The overvoltage protection device of the instant invention uses internal arcing to direct excessive overvoltage to ground and then the overvoltage protection device returns to the insulating state after the overvoltage condition. The overvoltage protection component relies on a different set of principles than the prior art to achieve overvoltage protection which allows for functionality enhanced performance and capability. Specifically, the overvoltage protection can be realized while eliminating loss of power which typically occurs when conventional devices are operated under a permanent bias voltage. Furthermore, rapid dissipation of excessive energy can be achieved.

A particular advantage of the present invention is the ability to provide multi-layer ceramic capacitors (MLCC) that can withstand very high electrostatic discharges (ESD) well beyond the limits of the prior art. These benefits will be apparent from the descriptions in the following sections.

A further advantage of the present invention is that it can also be used to provide a spark discharge gap device that allows the electrical energy to be transmitted at a certain voltage such as in detonation circuits, also referred to as fuzes. In these cases the overvoltage protection component offers a smaller, readily surface mountable solution compared to other solutions such as gas discharge tubes typically used for this purpose. The technology described in this invention also allows the functionality of a spark or discharge gap to be combined with that of the charging capacitor currently employed in detonation circuits. These benefits will be apparent from the descriptions in the following sections.

The problem of protecting circuits from overvoltage is solved by an overvoltage protection device designed to internally arc through controlled discharge gaps between electrodes of opposing polarity within the device. By arranging one or more discharge gaps between opposed electrodes, the electrode metal, electrode shape, shape of the discharge gap, the ceramic dielectric type, and the atmosphere present in the discharge gaps can be arranged such that at a predetermined voltage arcing occurs to ground. Furthermore, by adjusting these parameters the time constant for arcing can be adjusted to match the ramp rate of the voltage transients expected in the circuit.

The capacitance can be adjusted such that if the stored energy at a given voltage is exceeded the excessive energy is dissipated through the internal arcing. Since the internal arcing occurs at a predetermined threshold voltage the circuit can function with a permanently applied voltage without dissipating power. Excess voltage is conducted to ground as electrical energy. Although significant localized heating within the device may occur during the internal arcing process this is a secondary effect of the electrical energy dissipation to ground unlike a varistor that primarily dissipates the energy through heat. Temperature resistant ceramic construction is therefore preferred.

In the overvoltage protection component an arc is formed at a predetermined voltage. The arc may be in air or other atmospheres. The discharge gap in the overvoltage protection capacitor is preferably in a sealed environment with the resulting excess energy conducted away through heat or the opposing electrode to ground. The overvoltage protection component combines the spark or discharge gap principle with the materials and manufacturing methods used in MLCC manufacture to increase the scope and application voltages of these devices. Discharge gaps are formed between electrodes on the same plane between electrodes of opposite polarity. The overvoltage protection component of the present invention allows multiple spark or discharge gaps to be formed between electrodes of opposed polarity thereby increasing application voltage. Doping of the sacrificial material in the discharge gap can be used to control the surface formed in the discharge gap. Process methods can be used to control and introduce atmospheres other than air. Capacitance layers can be combined with the discharge gaps as required to provide dual functionality.

An embodiment of the invention is illustrated in cross-sectional view in FIG. 1. In FIG. 1, the overvoltage protection component, generally represented at 10, comprises an internal discharge gap, 12, which at least partially lacks dielectric, between electrodes, 16, of opposing polarity. The electrodes are in electrical contact with terminals, 14, of opposing polarity. The internal discharge gap has an arc distance, $D_1$, which must be less than the external distance, $D_2$, between terminals, 14, of opposed polarity in cases where the surfaces of the dielectric and atmosphere present are the same. The internal discharge gap can be formed during the manufacture of the device using techniques familiar in multi-layer capacitor (MLCC) manufacture. Particularly useful techniques include printing sacrificial material between the electrodes, such as carbon or organic filled ink, that are removed during the co-sintering of the layers. Another technique includes making a hole in the tape between the electrode layers.

The surface condition within the internal discharge gap is important in determining the creepage that corresponds to arcing across the arc distance at the threshold voltage. Different ceramic dielectric materials exhibit different creepage potentials so the threshold voltage at a given arc distance can be controlled. Paraelectric dielectrics, such as COG class materials, are far less prone to arcing than ferroelectric ceramics such as X7R or X5R class materials. In the case of printing of a sacrificial material doping with inorganic materials can be used to control the surface condition in the internal discharge gap. Additions of ceramic particles may be made to the sacrificial material to retain the discharge gap on processing. Alternatively, discharge gaps may be left in the sacrificial print to allow ceramic to flow into the discharge gap to form ceramic columns within the discharge gap to retain the size and shape of the discharge gap during subsequent processing wherein the column acts as a physical support between ceramic above and below the discharge gap.

Another important factor with respect to controlling the threshold voltage is the electrode material. Metals with different work functions will exhibit different threshold voltages, with respect to arcing, over the same distance. Also the gas present in the internal discharge gap and the energy required for ionization will also affect the threshold voltage.

Figure 2:
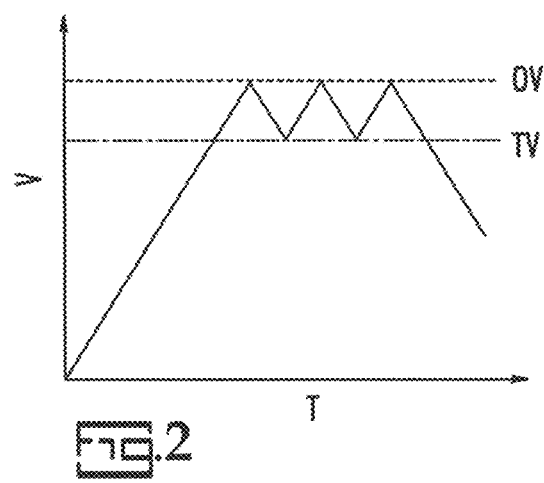
FIG. 2 is a diagrammatic illustration of an embodiment of the invention.

An advantage of the invention is illustrated in FIG. 2 wherein the function of the overvoltage protection component is illustrated in graphical view. In FIG. 2 voltage (V) as a function of time (T) is illustrated. Above an overvoltage condition (OV) internal arcing dissipates excess voltage to ground thereby returning to a threshold voltage (TV).

Figure 3:
FIG. 3 is an electrical schematic diagram of an embodiment of the invention.

An electrical schematic diagram illustrating an advantage provided by the present invention is provided in FIG. 3. If an overvoltage protection capacitor is inserted between an input voltage and ground once the threshold voltage is exceeded internal arcing occurs dissipating the excess energy to ground.

Figure 4:
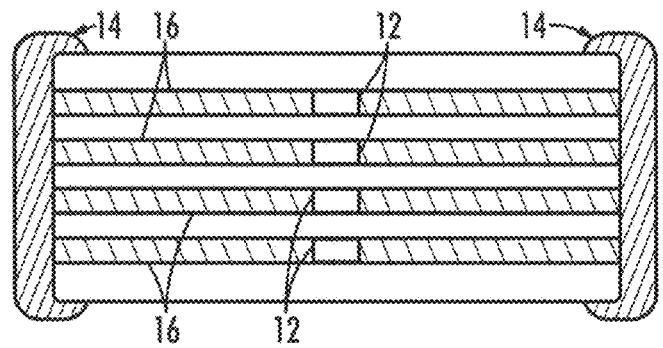
FIG. 4 is a schematic cross-sectional view of an embodiment of the invention.

An embodiment of the invention is illustrated in cross-sectional schematic view in FIG. 4. In FIG. 4 multiple layers of electrodes, 16, are provided with internal discharge gaps, 12, in each. The electrodes are between external terminations, 14. This arrangement provides an overvoltage protection component which is capable of handling higher currents, and more energy, than a single layered overvoltage protection component.

Figure 5:
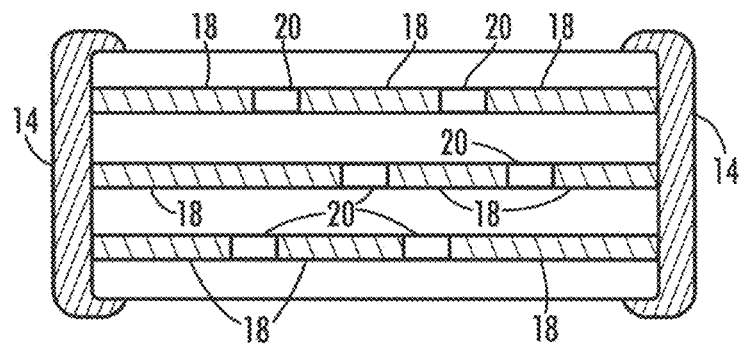
FIG. 5 is a schematic cross-sectional view of an embodiment of the invention.

Capacitance and overvoltage protection is illustrated in cross-sectional schematic view in FIG. 5. In FIG. 5, electrodes, 18, are provided with each electrode having multiple internal discharge gaps, 20, within each electrode. The electrodes are between external terminations, 14. With multiple discharge gaps in an electrode the potential required to achieve internal arcing will be raised thereby increasing the threshold voltage.

Figure 6:
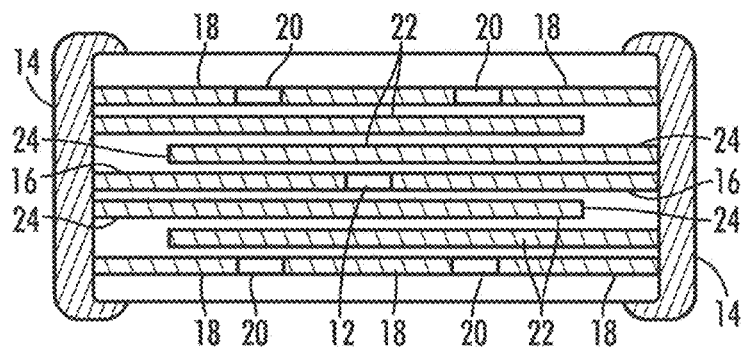
FIG. 6 is a schematic cross-sectional view of an embodiment of the invention.

An embodiment of the invention is illustrated in cross-sectional schematic view in FIG. 6 wherein dual functionality is provided. In FIG. 6 alternating capacitor electrodes, 22, of opposing polarity with an active dielectric, 24, at least between the capacitor electrodes provides a capacitive couple between the external terminations, 14. Overvoltage protection is provided by at least one electrode, 16, with a discharge gap, 12, therein, or at least one electrode, 18, with multiple discharge gaps, 20, therein. This embodiment achieves more capacitance with the energy stored in the active capacitor layers and which allows transient surge voltages to be dissipated by discharge through the discharge gap thereby avoiding damage of the dielectric.

An electrical schematic diagram of an electronic device, 100, is illustrated in FIG. 7 wherein the device comprises a circuit, 101, with a device as illustrated in FIG. 6. In FIG. 7, a standard MLCC capacitor, C1, is in electrical parallel with an overvoltage protection component (OVP). When used to protect transmission circuitry a high capacitance capacitor is not desirable since this may result in signal distortion.

Gases can be used in the internal discharge gaps to control the threshold voltage wherein the lower the ionization potential of the gas the lower the threshold voltage. It is therefore desirable, in some embodiments, to process overvoltage protection capacitors with a controlled gas atmosphere within the internal discharge gaps. This can be achieved by controlling the process atmosphere during the co-sintering of the device or by forming the internal discharge gap to the outside of the final device. Particularly preferred gases include atmospheric air or an inert gas selected from He, Ne, Ar, Kr or Xe. Nitrogen and hydrogen may also be used and mixtures of these gases can be employed to alter the breakdown and recovery of the device. Paschen's law states that the breakdown characteristics of a discharge gap (V) are a function of the gas pressure (p) and the discharge gap length (d); V=f(pd). For an air atmosphere and discharge gaps of the order of 1 mm: V=30 pd+1.35 kV, where d is the gap length in cm and p is the air pressure in atmospheres. Most gases have a non-linear response with variation in pressure so mixtures are employed to tailor this for a given application. Pure inert gases are only preferred for high voltages. Other factors such as temperature, humidity and the secondary ionization potential can also affect the breakdown voltage. Vapors may also be introduced to the discharge gap to act as replenishers, the best known of these is mercury vapor used extensively in fluorescent tubes but for gas discharge function the introduction of alcohol or halogen vapors can be beneficial since their high electronegativity and ability to absorb UV light can help dampen the discharge.

An embodiment of the invention is illustrated in schematic cross-sectional side view in FIG. 8A and in schematic cross-sectional top view in FIG. 8B. In FIGS. 8A and 8B the electrodes, 16, between external terminations, 14, have discharge gaps, 12, which are within a channel, 24, wherein the channel is in flow communication beyond the capacitor body. A gas is entered into the channel and a gas tight seal, 22, is placed over the opening of the channel thereby securing the gas within the chamber.

An embodiment of the invention is illustrated in schematic top view in FIG. 8C. In FIG. 8C the discharge gap is between the terminal, 14, and inner electrode, 16. This embodiment avoids the additional process necessary to add gas tight seals. The external termination itself functions to seal the gas within the discharge gap. Suitable termination materials would not flow into the discharge gap since the distance must be controlled to insure arcing at a defined threshold voltage and the termination would have to be applied in the gas atmosphere required. Suitable termination materials include conductive adhesives, TLPS conductive adhesives and thick films that are processed using a pulse thermode or high power, high frequency light to sinter the termination.

In the case of base metal electrodes, such as nickel or copper, reducing atmospheres are used during the co-sintering of the multi-layers and an oxygen annealing stage is typically used to re-oxidize the ceramic oxides thereby replacing any oxygen vacancies formed during the sintering process. By careful selection of the dielectric material and annealing atmosphere the composition of gas within the discharge gap can be controlled.

Figure 9:
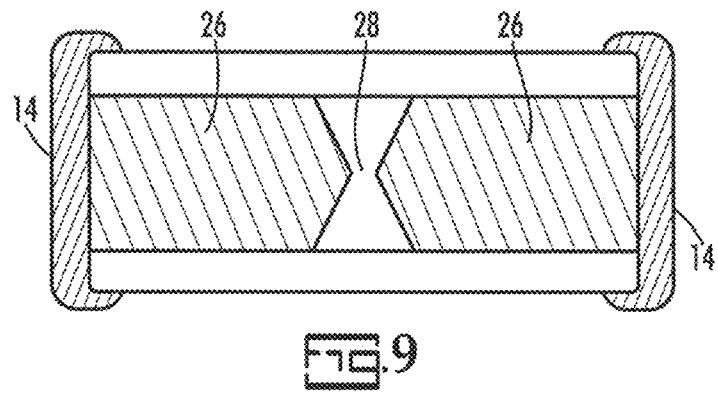
FIG. 9 is a schematic cross-sectional view of an embodiment of the invention.

An embodiment of the invention is illustrated in schematic top cross-section view in FIG. 9. In FIG. 9 at least a portion of the inner electrodes, 26, converge thereby concentrating charge at a narrow portion of the closest approach of opposing electrodes at the narrowest portion of the discharge gap, 28. By concentrating the charge at the narrowest portion of the electrode the threshold voltage can be reduced.

Figure 10:
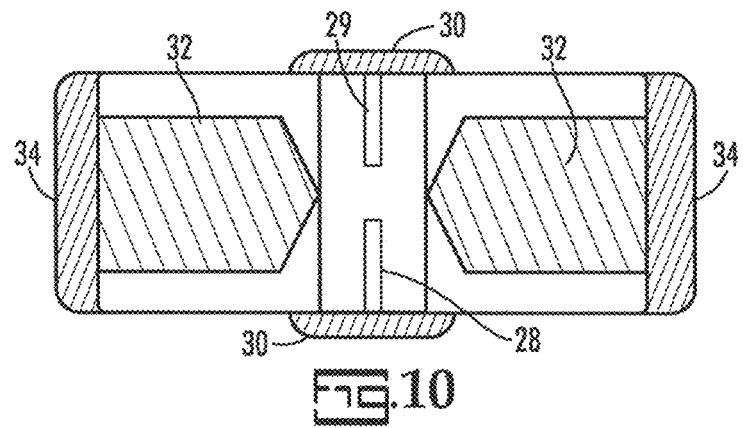
FIG. 10 is a schematic cross-sectional view of an embodiment of the invention.

An embodiment of the invention is illustrated in schematic top view in FIG. 10. In FIG. 10 a three-terminal overvoltage protection component is illustrated wherein ground electrodes, 29, with associated ground terminations, 30, reside in the discharge gap. The discharge gap may be a gas filled discharge gap. The electrodes, 32, which preferably converge as they approach each other, are electrically connected to external terminations, 34. The three-terminal device is particularly suitable for use between two transmission lines wherein the overvoltage can be directed to ground in either transmission line or in both lines.

Figure 36:
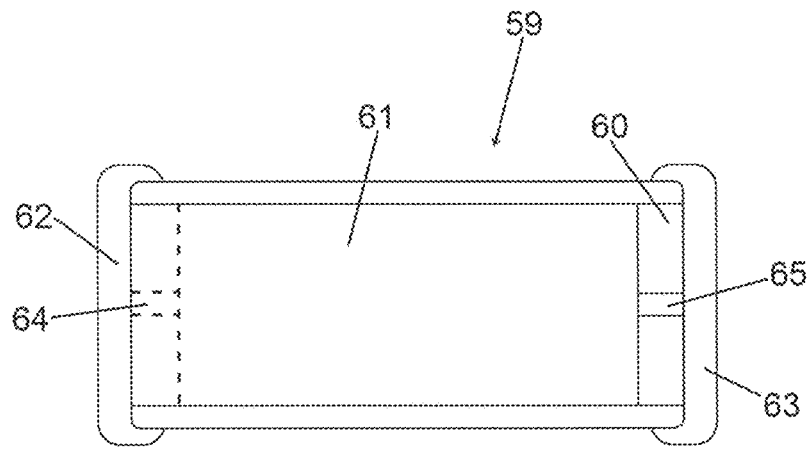
FIG. 36 is a schematic cross-sectional top view of an embodiment of the invention.
Figure 37:
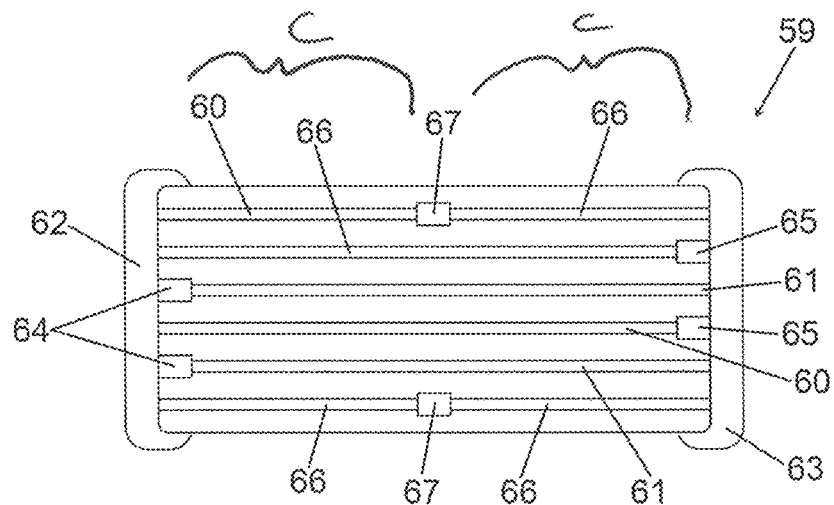
FIG. 37 is a schematic cross-sectional side view of an embodiment of the invention.

An embodiment of a discharge capacitor, 59, is illustrated in top cross-sectional schematic view in FIG. 36 and in side cross-sectional schematic view in FIG. 37. In the embodiment of FIGS. 36 and 37 internal electrodes, 60 and 61, with dielectric therebetween alternately terminate at opposite external terminations, 62 and 63. As would be realized adjacent internal electrodes are considered to be of opposite polarity thereby forming a capacitive couple region denoted by "C". Between each internal electrode and the external termination of opposite polarity is a first discharge gap, 64, and a second discharge gap, 65. In one embodiment either the first discharge gaps or the second discharge gaps may be excluded. Optional shield electrodes, 66, which are preferably coplaner with a shield electrode of opposite polarity is preferable for high voltages, above 200Vdc or 100Vac, applications. In one embodiment a shield discharge gap, 67, may be incorporated between coplaner shield electrodes. A shield electrode is the outermost electrode and at least one shield electrode of a coplaner pair has common polarity with an adjacent internal electrode.

Figure 38:
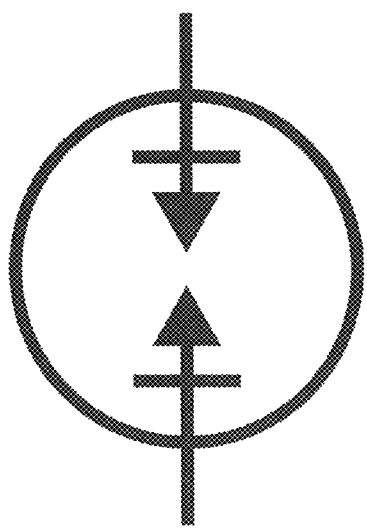
FIG. 38 is an electrical schematic diagram of an embodiment of the invention.

An electrical schematic diagram of the discharge capacitor of FIGS. 36 and 37 is illustrated in FIG. 38 wherein illustrated is a capacitor with a discharge gap in series therewith. As would be realized from the discussion, the capacitive function operates below a discharge voltage yet above the discharge voltage the charge is dissipated across the discharge gap without harm to the device.

Figure 39:
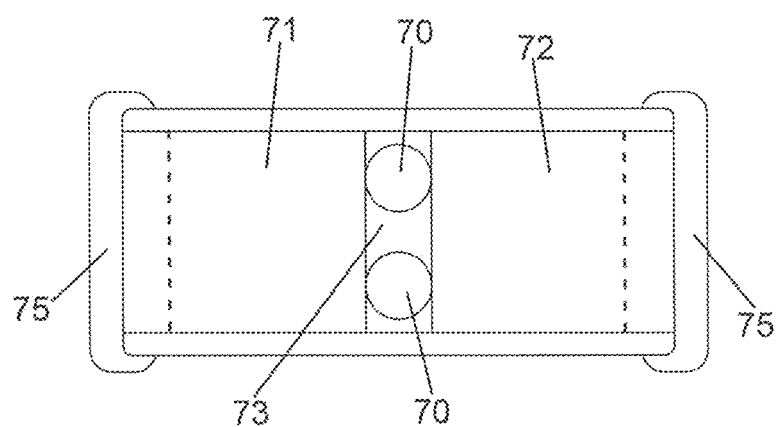
FIG. 39 is a schematic cross-sectional top view of an embodiment of the invention.
Figure 40:
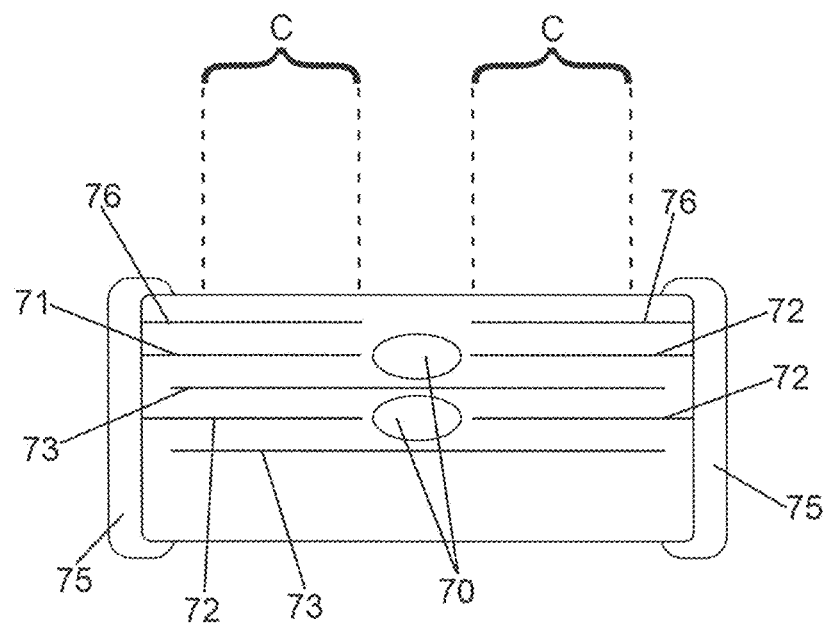
FIG. 40 is a schematic cross-sectional side view of an embodiment of the invention.

A discharge capacitor is illustrated in cross-sectional schematic top view in FIG. 39 and in schematic cross-sectional side view in FIG. 40. In FIGS. 39 and 40 multiple discharge gaps, 70, are provided between coplaner terminated internal electrodes, 71 and 72, of opposite polarity with each terminating at an external termination, 75. Multiple discharge gaps provide additional discharge gap volume thereby improving the discharge capability of the device. Multiple gaps may be used in a single plane or in multiple planes. Floating internal electrodes, 73, which do not terminate at any external termination, are parallel to the terminated internal electrodes and interspersed there between. Dielectric is between adjacent electrodes. The capacitive couple region, denoted by "C", is defined as the overlap of electrodes. Shield electrodes, 76, are optionally provided to increase the operating voltage of the device.

Figure 41:
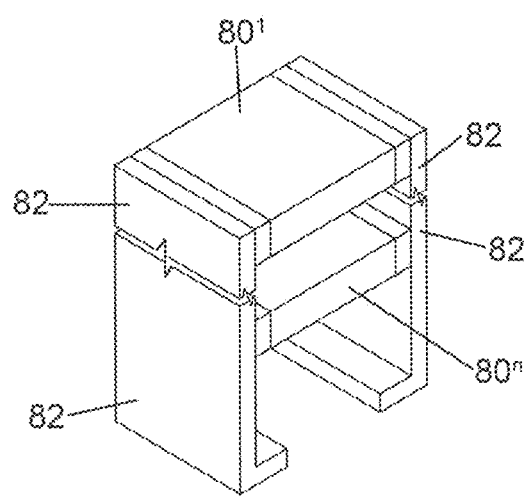
FIG. 41 is a schematic top perspective view of an embodiment of the invention.

An embodiment of the invention is illustrated in top perspective schematic view in FIG. 41. In FIG. 41 a multiplicity of devices, 80, are provided between lead frames, 82. At least one device, 80, comprises an overvoltage protection device which may include capacitance function as a discharge capacitor. In its simplest form all of the devices within the stack are this type such that the available capacitance can be increased for a given board space. It is also possible that in addition to one overvoltage protection device the remaining devices may be a capacitor, preferably a multi-layered ceramic capacitor, an inductor, a resistor, a thermistor, each of which is protected from surge voltage by the overvoltage protection device in electrical parallel therewith.

A filter incorporating an embodiment of the invention is illustrated in an electrical schematic diagram in FIG. 42. In FIG. 42 a power source, 110, which is preferably an AC power source, provides power to a device, 112. The power source generates transients and electromagnetic interference (EMI)

which is desirably filtered. The device also generates EMI which is desirably filtered. A filter, 114, is provided between the power source and the device to filter transients, which typically occur on the power source side of the filter, and EMI, which may be generated from the power source or device. Two power lines, 116, are illustrated wherein each power line has an inductor, 117, and a discharge capacitor, 118, between the power lines. A capacitor, 118, between power lines is referred to in the art as an X-type capacitor and the discharge capacitor, 118, is referred to herein as an X-type discharge capacitor. Each power line is filtered to ground, 120, by a discharge capacitor, 122, such that a surge in either power line will be discharged to ground. A capacitor between power and ground is referred to in the art as a Y-type capacitor and the discharge capacitors, 122, herein are referred to as Y-type discharge capacitors.

The discharge capacitors of the present invention allow for continuous operation at operating voltage, typically about 100 volts to 500 volts at typical frequencies of about 30 to 1000 Hertz. The discharge capacitors must also be able to survive multiple transient pulses in rapid succession.

Typical surges are generated by controlled events, such as equipment cycling on and off, or by uncontrolled events, such as lightening strikes, and the controlled and uncontrolled events may be uncorrelated or correlated. A lightening strike, for example, may generate a surge which causes certain equipment to cycle off momentarily thereby requiring the filter to filter off the surge from the lightning followed, after a very short duration, by a subsequent surge due to equipment cycling on. Large surge crest, such as above about 4 kV are preferably filtered by a Y-type discharge capacitor.

Surge crest above about 4 kV are typically associated with atmospheric interference such as lighting and the duration is typically about 0.01 to about 0.1 µs. Fuse failures, flash over and other failure in electrical equipment represents about 80% of the daily transients and typical generate a surge of about 1 to 2 kV with a pulse duration of about 60 µs. Electrical equipment power cycles typically generate pulses of about 800 V with a duration of about 200 µs. Rectifier, thyristor and triac applications such as inverters and welding equipment typically generate 400 V pulses with a duration of about 1000 µs. The present invention allows for surge protection well above 1.2 kV and are suitable for use well over 2.5 kV which typically can only be achieved, using multilayered ceramic capacitor technology, with very thick active layers and multiple capacitor overlap areas in series both of which are contrary to the ongoing desire for miniaturization in electronic devices and electronic components.

The overvoltage protection devices dissipate overvoltage to ground thereby allowing capacitors to achieve higher electrostatic discharge capability. In standard MLCC's if the voltage applied to the capacitor during the electrostatic discharge (ESD) event exceeds the breakdown voltage the component fails. However, by incorporating a discharge gap, thereby forming an integral overvoltage protection device, the voltage applied during the ESD event is dissipated by internal arcing before any damage occurs to the capacitive couple. External arcing has been used to protect ESD susceptible MLCC's with varying degrees of success because of factors such as the surface of the part can be exposed to various environmental conditions, contaminants and/or coatings that affect the external arc and therefore the ability to control the arc voltage is thwarted. Internal arcing provides a consistent way to realize high ESD capable capacitors. More particularly the overvoltage protection component provides a way of protecting sensitive capacitors from overvoltage in a small, low capacitance, MLCC which is the type of capacitor most susceptible to failures caused by ESD.

Figure 10A:
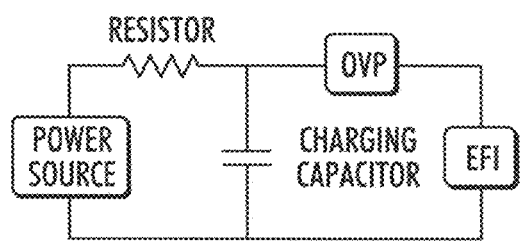
FIG. 10A is an electrical schematic diagram illustrating an embodiment of the invention.

Furthermore, the overvoltage protection components (OVP) described in this invention can also provide a spark or discharge gap for a detonation circuit, that are also described as fuzes. In these cases the overvoltage protection device would be placed between the power source and electronic fuze initiator (EFI) as shown in FIG. 10A. The overvoltage protection device (OVP) replaces other spark or discharge gap devices such as gas discharge tubes, that typically take up more volume, thus allowing the circuit to be miniaturized. Also, per the teachings of this invention, by combining three or more terminals with an appropriate capacitance an overvoltage protection device can be designed that combines the functionality of the charging capacitor and a spark or discharge gap allowing for further miniaturization.

In addition to the protection from ESD events and their use in fuzes the overvoltage protection afforded in discharge capacitors of the present invention allows them to survive high voltage surges whilst suppressing electromagnetic interference. This allows the discharge capacitors of the present invention to achieve high capacitance within a given volume compared to multi-layer ceramic capacitors of similar design.

The electrodes are not particularly limited herein with any conductor suitable for demonstration of the teachings. Electrodes suitable for use in capacitors are particularly suitable due to their wide spread availability and the ability to manufacture overvoltage protection components in a manufacturing facility designed for the manufacture of capacitors, and particularly multi-layered ceramic capacitors. Base metal electrodes are particularly suitable for demonstration of the invention as are precious metal electrodes.

The ceramic material used as a dielectric or as a material in the discharge gap is not particularly limited herein. Materials suitable for use in COG and X7R capacitors are particularly suitable for use in the demonstration of the present invention due to their wide spread use in the manufacture of MLCC's and the ability to manufacture overvoltage protection components in facilities designed for the manufacture of MLCC's.

It will be recognized to those skilled in the art of MLCC manufacturing that combinations of the aforementioned materials and processes allow for a broad range of different overvoltage protection components to be realized. The application of this technology is described in the following non-limiting examples that describe how overvoltage protection components can be formed using similar processes to MLCC manufacture.

EXAMPLES 1/1A

A base metal electrode (BME) multi layer ceramic capacitor (MLCC) with a X7R temperature coefficient in 1812 case size was constructed so that an air discharge gap existed between two internal electrodes of opposite polarity to incorporate an overvoltage protection component in an MLCC. The ceramic dielectric material was a $BaTiO_3$ based formulation compatible with the Ni internal electrodes. The length of the unfired, or green, capacitor was approximately 5.33 mm (0.21 inches) and the width was approximately 3.81 mm (0.15 inches).

Figure 11:
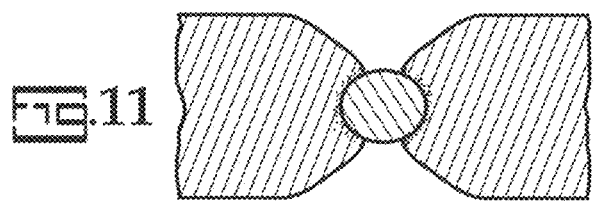
FIG. 11 is a schematic partial cross-sectional view of an embodiment of the invention.

The unfired, or green, capacitors were assembled using a dry layer build up process typical in the MLCC industry that incorporates screen printed internal electrodes. The electrodes were screen printed in a pattern containing an array of 1200 capacitors that were singulated into individual green capacitors after the build up process. A small drop of resin was dispensed by pneumatic syringe onto several green ceramic tape layers in the area between the opposing electrodes such that it spanned the discharge gap and contacted each electrode. These samples of the overvoltage protection component were labeled Example 1A and compared to the other MLCC manufactured at this time, the control group Example 1. The discharge gap between the opposing electrodes was 0.03 mm (0.012 inches) and the diameter of the resin drop was typically 0.38 mm (0.015 inches). The internal electrode was made such that the width of the electrode was approximately 3.20 mm (0.126 inches) and length was 5.03 mm (0.198 inches). The ends of the electrode were tapered, with the taper starting at approximately 8.13 mm (0.032 inches) from the end of the electrode and tapered down to a width of approximately 2.44 mm (0.096 inches). FIG. 11 contains an illustration of the electrode and the resin drop. The resin was applied to approximately 30% of the printed electrode array. The green capacitors surrounding the area with the resin drops served as a control group. The sacrificial resin was removed during the binder burnout processing described below, leaving an air filled discharge gap. The resin was a solution of mainly ethyl cellulose and plasticizers dissolved into dihydro terpineol, with a solids content of approximately 5%. The total green tape thickness for each active layer was 40 microns and for each blank ceramic layer was 25 microns. The capacitors contained 28 total internal electrode layers. After stacking 9 blank ceramic layers and 14 electrode layers the stacking process was paused and two blank ceramic layers were inserted into the stack followed by one printed layer containing the resin drop which was positioned such that the discharge gap between the electrodes was in the approximate center of the capacitor. Next three blank ceramic layers were inserted into the capacitor stack followed by the remaining 13 electrode layers and 9 blank ceramic layers. The entire stack was subjected to a lamination pressure cycle sufficient to bond all layers together.

The organic binders were removed from the green capacitors by heating in a controlled atmosphere to 230-280° C. over a period of 40-96 hours. The atmosphere consisted of nitrogen, oxygen, and water vapor with an $O_2$ concentration of 5-21% and a dewpoint of 30-60° C. After binder burnout, the capacitors were fired at 1280-1320° C. for two hours in a reducing atmosphere of nitrogen, hydrogen, and water vapor with a $pO_2$ of $10^{-8}$ to $10^{-10}$ atmospheres of oxygen and a dewpoint of 25-40° C. Ramp rate up to the peak temperature ranged from 1-5° C. per minute. During cooling from the peak temperature, the capacitors were subjected to a reoxidation process at 750-1050° C. for two to eight hours. The atmosphere during reoxidation consisted of nitrogen, oxygen, and water vapor with a $pO_2$ of 5-100 PPM $O_2$ and dewpoint of 30-40° C. The reoxidation process restores oxygen to the dielectric crystal structure to eliminate oxygen vacancies which may have occurred during firing.

After thermal processing the sintered capacitors were subjected to abrasive tumbling to smooth any sharp edges and corners and to fully expose the internal electrodes. After abrasive tumbling a fritted copper termination paste was applied to the ends of the capacitors to establish an electrical connection to the exposed internal electrodes. After the copper paste was dry, the capacitors were passed through a termination sintering furnace utilizing a nitrogen atmosphere with low partial pressure of oxygen and controlled temperature profile to oxidize the binders and sinter the termination. The temperature in the furnace was increased from room temperature to 870° C. at a ramp rate of approximately 20° C./min, followed by a gradual cool down to room temperature.

After termination an electroplated Ni barrier layer ranging in thickness from 1.27 µm (50µ in) to 3.81 µm (150µ in) was applied over the copper termination, followed by an electroplated layer of Sn in thickness ranging from 2.54 µm (100µ in) to 7.52 µm (300µ in).

Figure 12A:
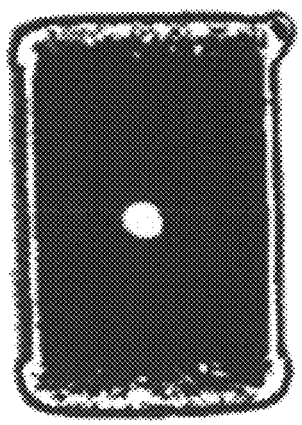
FIG. 12A is a schematic partial cross-sectional view of an embodiment of the invention.
Figure 12B:
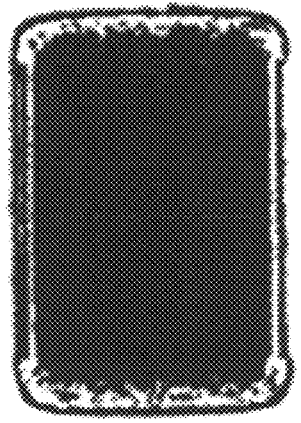
FIG. 12B is a schematic partial cross-sectional view of a standard multi-layer capacitor used as a control.
Figure 13:
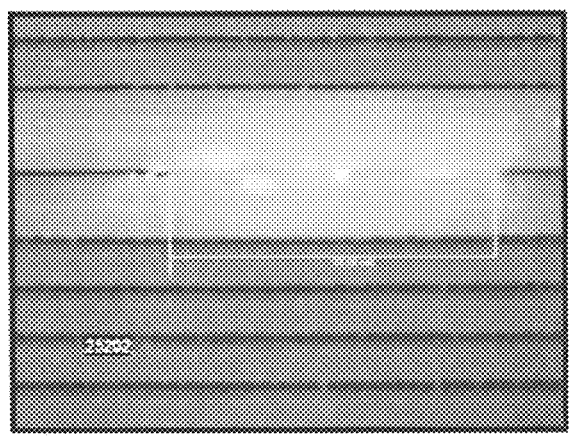
FIG. 13 is cross-sectional view of an embodiment of the invention.

After thermal processing, the capacitors were examined using a non-destructive C-mode scanning acoustical microscope (CSAM) to indicate the size and location of the internal air discharge gaps. The examination confirmed that the resin was removed during thermal processing and an internal air filled discharge gap was present in the overvoltage protection component samples (Example 1A). In addition, destructive physical analysis (DPA) was performed to characterize the internal gap. CSAM images of an MLCC with the discharge gap and a control are shown in FIGS. 12A and 12B respectively. A photo of the air filled discharge gap found during DPA is shown in FIG. 13. CSAM was used to sort the MLCC's with the air filled discharge gap so as to choose parts with consistent size air filled discharged gaps.

The selected capacitors with the internal air filled discharged gap (Example 1A) representing an overvoltage protection component and the control capacitor parts (Example 1) were subjected to a voltage ramp of 300 volts/second up to ultimate voltage breakdown (UVBD) followed by a second voltage ramp to breakdown at the same voltage ramp rate. Voltage breakdown is characterized by a sudden increase in measured current, usually due to breakdown of the dielectric layer but this can also be due to arcing across the surface of the capacitor between the terminals. A second UVBD test was performed to confirm whether the high current measurement during the first UVBD test was due to dielectric breakdown or due to surface arcing.

Figure 14:
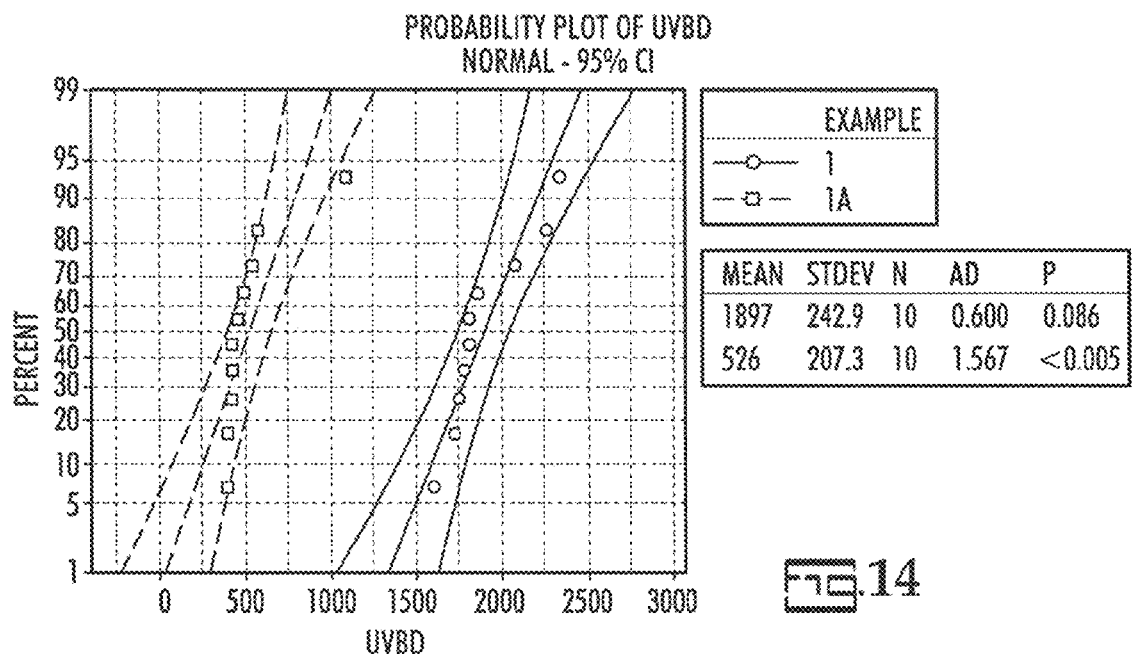
FIG. 14 is a plot illustrating an advantage of the present invention.

The expected average UVBD for this capacitor design and material set is 45 to 55 volts/micron. As can be seen in Table 1, the average UVBD for the control group is 1897 volts which is in the expected range. However, the test group has a significantly lower initial UVBD of 526 volts. The initial UVBD distributions are shown in FIG. 14.

Figure 15:
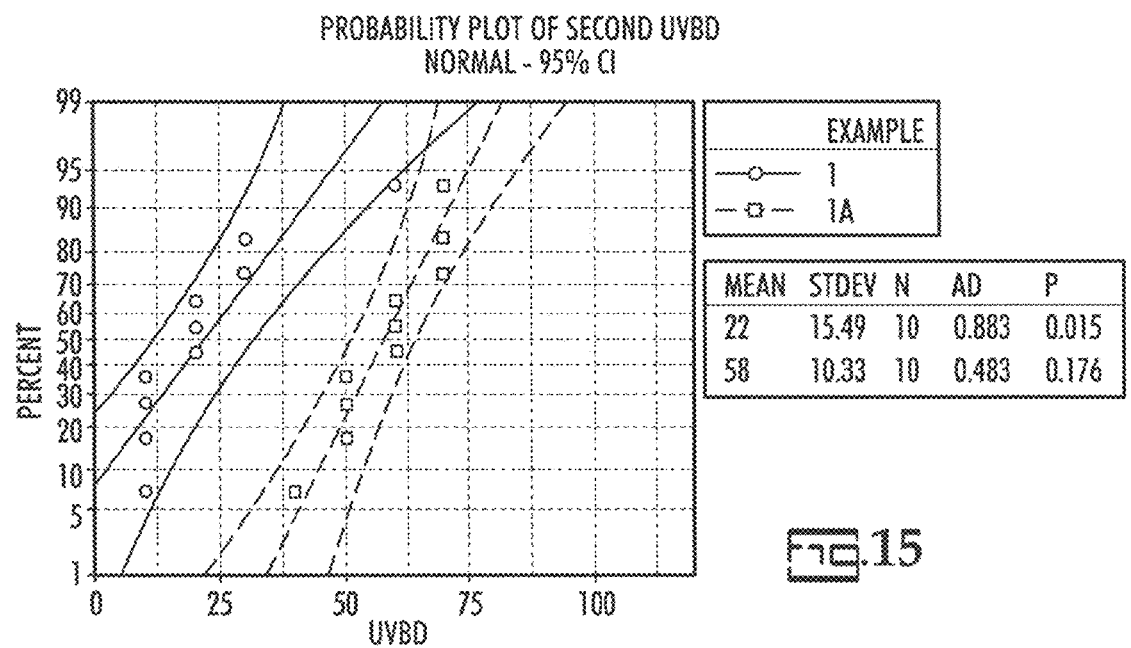
FIG. 15 is a plot illustrating an advantage of the present invention.

The average second UVBD for the control group (1) is 22 volts, indicating that the control group experienced catastrophic dielectric breakdown as a result of the UVBD voltage. The average second UVBD for the test group (1A) is 58 volts. The second UVBD for the test group shows that it retains the ability to take some charge before dissipating the charge through the internal discharge gap. The second UVBD distributions are shown in FIG. 15. DPA examination of the internal construction of the test group after the application of UVBD voltage shows no evidence of dielectric breakdown in the area of the air filled discharge gap.

Figure 16:
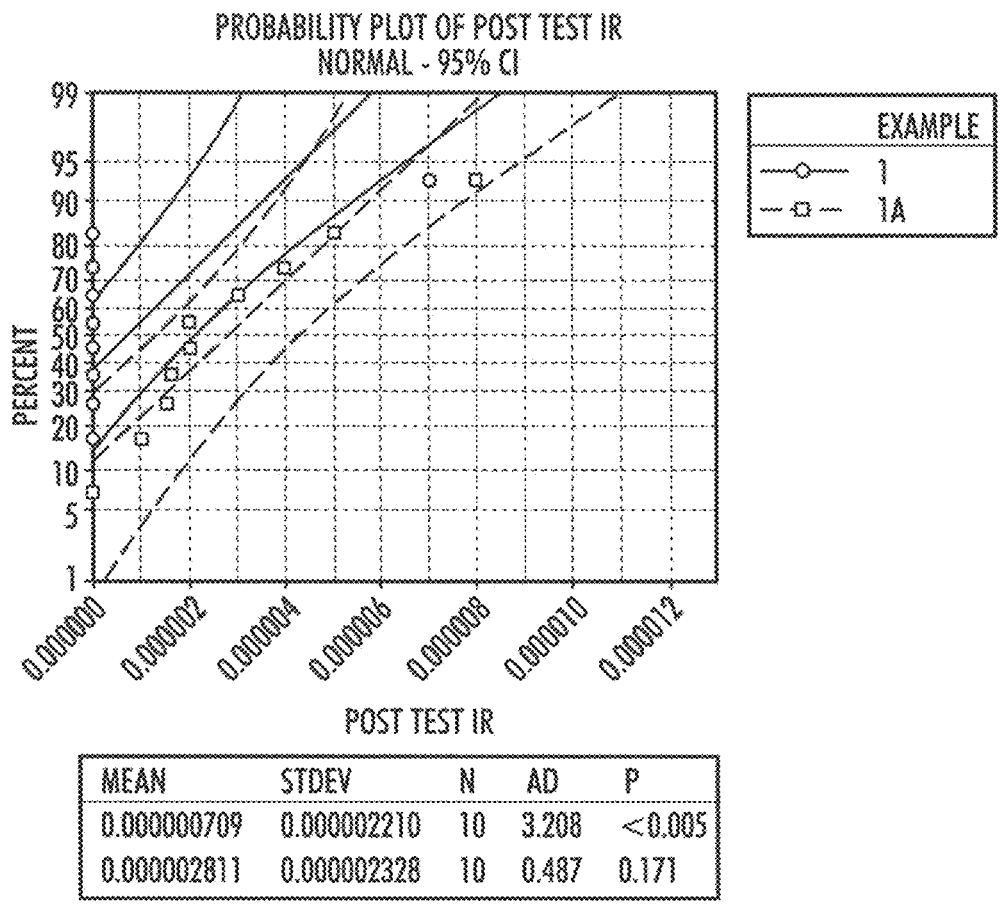
FIG. 16 is a plot illustrating an advantage of the present invention.

The electrical and physical examinations indicate that the MLCC's containing an internal discharge gap dissipated the voltage applied during UVBD testing by arcing internally. However the shift in UVBD for the test group (1A) from 520 volts to ≤100 volts between the first and second UVBD tests indicates a permanent change in the ability of the MLCC's with this design of internal discharge gap to dissipate voltage. An indication of this change is the change in insulation resistance (IR) after the second UVBD test as shown in Table 1. The decrease in IR for the control group (1) shown in FIG. 16 to ≤10 k Ohms after UVBD testing is consistent with a decrease in the IR observed after dielectric breakdown. The post UVBD IR of the test group (1A) is higher on average than the control group.

TABLE 1

Capacitance, DF, UVD and IR performance for Examples 1-5D (Averages are noted unless stated otherwise.).

| Example | Initial Cap, nF n = 10 | Initial DF, % n = 10 | Initial IR, G Ohms n = 10 | Initial UVBD, volts n = 10 | Second UVBD, volts n = 10 | Post UVBD Cap, nF n = 10 | Post UVBD DF, % n = 10 | Post UVBD IR, G Ohms n = 10 |
|---|---|---|---|---|---|---|---|---|
| 1 | 154 | 1.0 | 11.0 | 1897 | 22 | 155 | 4.7 | <0.01 |
| 1A | 160 | 1.1 | 10.5 | 526 | 58 | 160 | 3.6 | <0.01 |
| 2 | 154 | 1.1 | 14.1 | 1832 | 20 | 155 | 4.8 | <0.01 |
| 2B | 160 | 1.1 | 14.4 | 466 | 97 | 161 | 2.2 | <0.01 |
| 3 | 7.7 | <0.02 | 2800 | 1678 | 271 | Shorted | Shorted | <0.01 |
| 3C | 7.8 | <0.02 | 3000 | 1457 | 986 | 7.8 | <0.02 | Range 0-5490 |
| 4* | 0.23 | <0.02 | 10200 | 2240 | 793 | 0.23 | <0.02 | 4600 |
| 4D | 0.23 | <0.02 | 9350 | 1626 | 1507 | 0.23 | <0.02 | 8400 |
| 5 | 0.82 | 0.006 | 2680 | 2259 | 1086 | 0.82 | <0.02 | 2030 |
| 5E | 0.82 | 0.007 | 3540 | 1427 | 1520 | 0.82 | <0.02 | 3280 |

*only 8 samples were measured in this example.

EXAMPLES 2/2B

In Examples 2 & 2B a base metal electrode (BME) multi layer ceramic capacitor (MLCC) with X7R class materials in 1812 case size was constructed in the same manner as described in Examples 1 & 1B so that an air filled discharge gap existed between two internal electrodes of opposite polarity in the case of Example 2B, except that the capacitors contained three layers with a drop of resin. After stacking 9 blank ceramic layers and 14 electrode layers the stacking process was paused and two blank ceramic layers were inserted into the stack followed by three printed layers containing the resin drop which were positioned such that the discharge gap between the electrodes in each layer was in the approximate center of the capacitor. Next three blank ceramic layers were inserted into the capacitor stack followed by the remaining 13 electrode layers and 9 blank ceramic layers. The entire stack was subjected to a lamination pressure cycle sufficient to bond all layers together.

Figure 17:
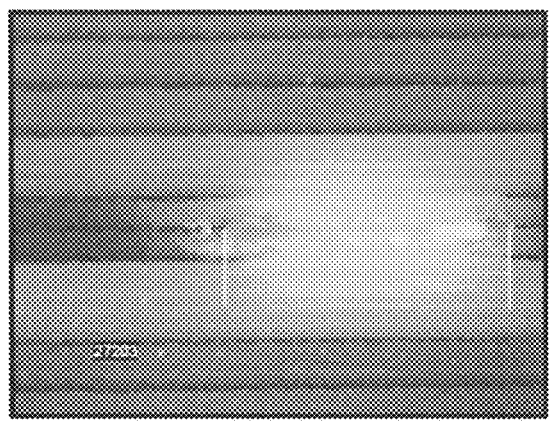
FIG. 17 is cross-sectional view of an embodiment of the invention.
Figure 18:
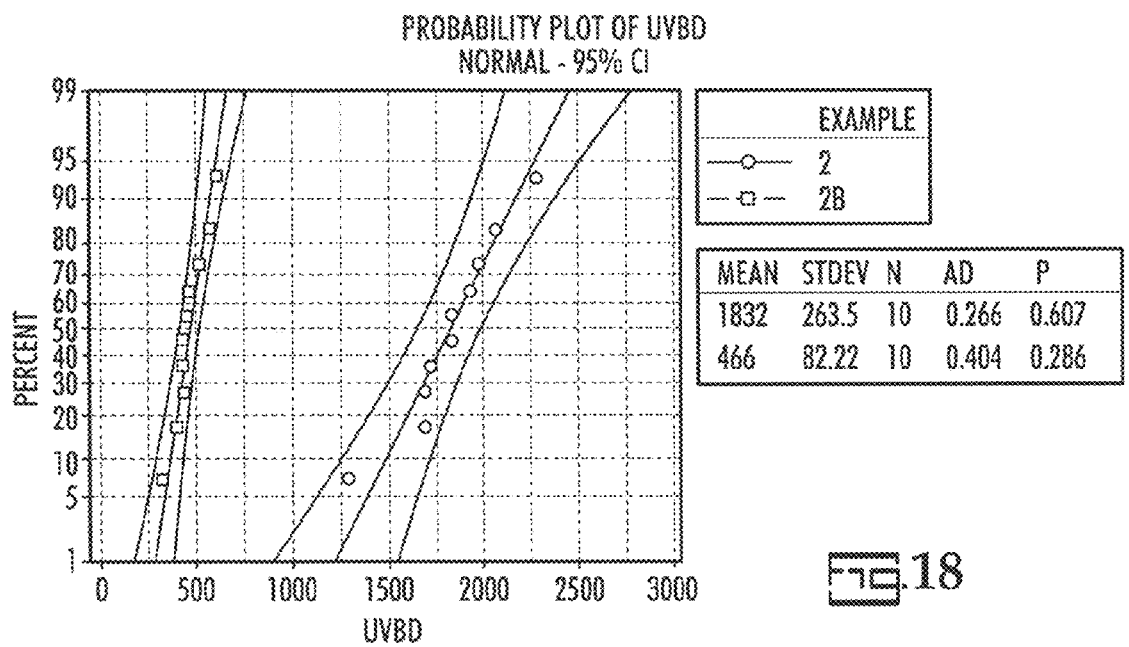
FIG. 18 is a plot illustrating an advantage of the present invention.
Figure 19:
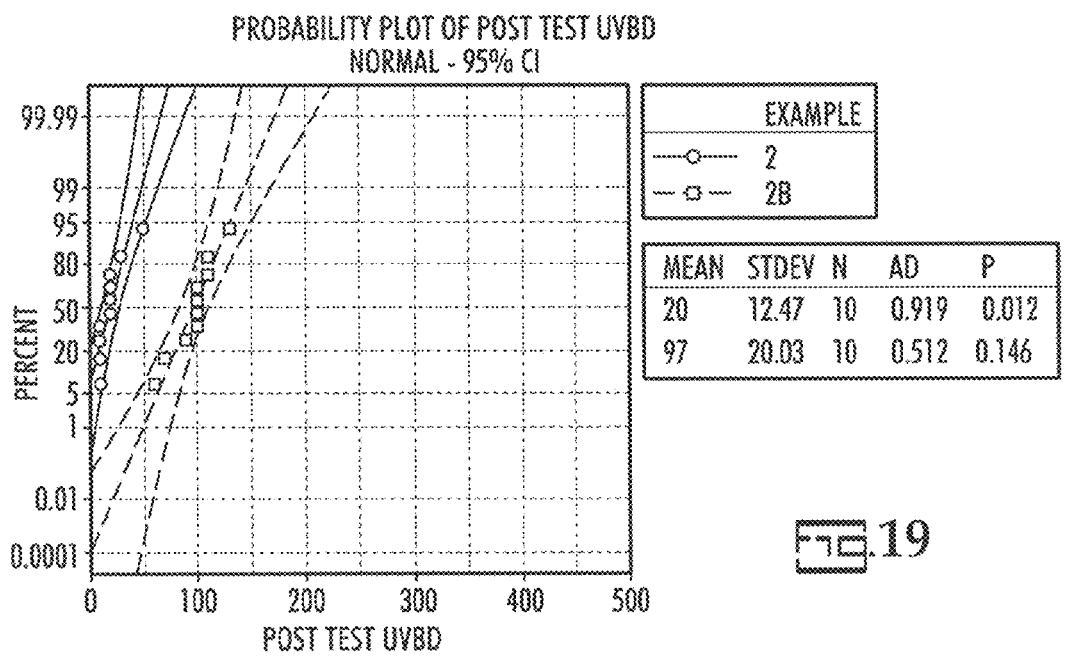
FIG. 19 is a plot illustrating an advantage of the present invention.
Figure 20:
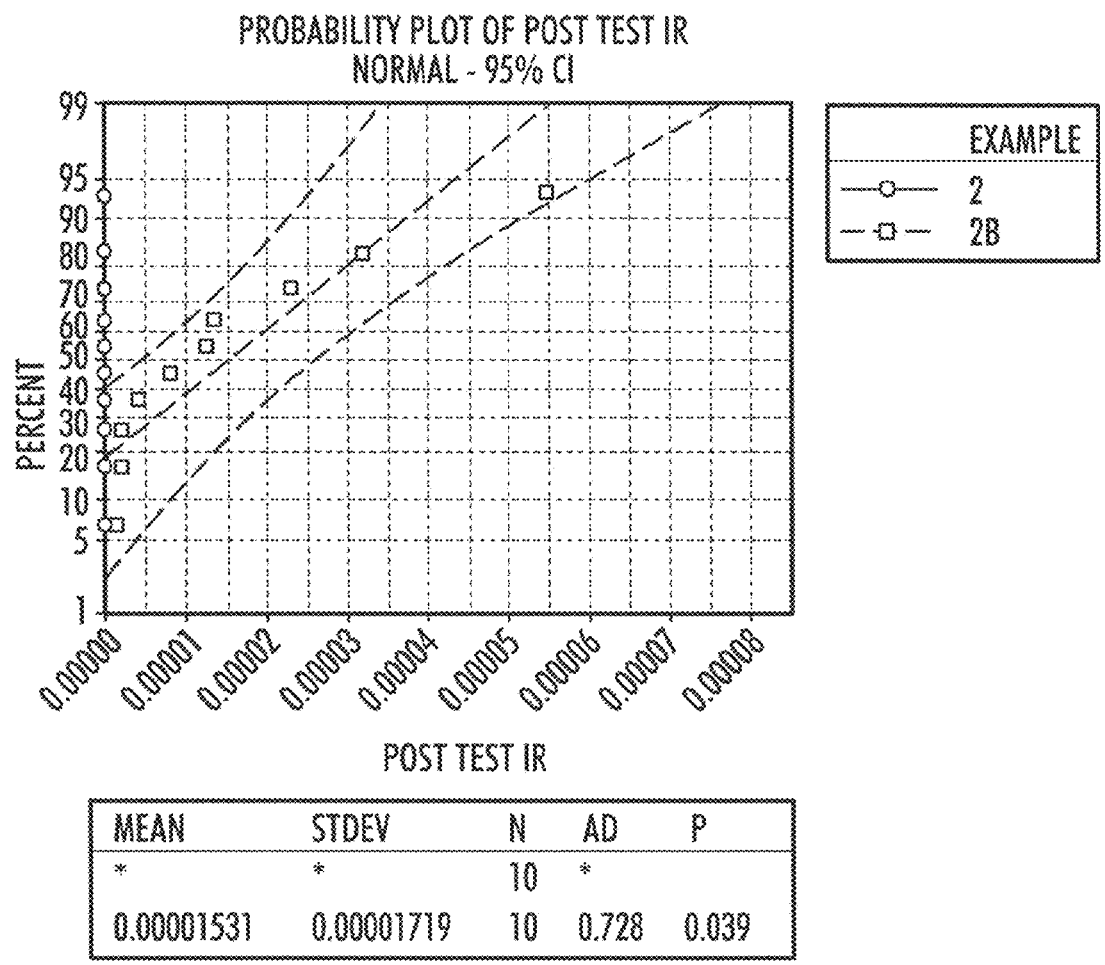
FIG. 20 is a plot illustrating an advantage of the present invention.

The selected capacitors with the internal air filled discharge gap and the control parts were subjected to a voltage ramp of 300 volts/second up to voltage breakdown, followed by a second voltage ramp to breakdown at the same voltage ramp rate. The initial UVBD of the control group was again in the expected range at 1832 volts (Table 1.). The second UVBD of the control group appears to be similar to the second UVBD of Example 1, but the test group exhibits a small increase in the average second UVBD, from 58 volts in Example 1A to 97 volts in Example 2B. A small increase in insulation resistance can also be seen in Example 2B after the second UVBD test compared to Example 1A. DPA examination of the internal construction of the test group after the application of UVBD voltage shows no evidence of dielectric breakdown in the area of the air filled discharge gap and a cross-section is shown in FIG. 17. The distributions of Example 2 & 2B for initial UVBD, Second UVBD and IR after second UVBD are shown in FIGS. 18, 19 and 20 respectively.

EXAMPLES 3 & 3C

In Example 3 & 3C a base metal electrode (BME) multi layer ceramic capacitor (MLCC) with COG class materials in 1812 case size was constructed in the same manner as Examples 2 & 2B so that an air filled discharge gap existed between two internal electrodes of opposite polarity in the case of 2B, except that the capacitors were constructed using CaZrO$_3$ based dielectric material compatible with Ni internal electrodes. The total green tape thickness for each active layer was 17 microns and for each blank ceramic layer was 5.8 microns. The capacitors contained 61 total internal electrode layers. After stacking 40 blank ceramic layers and 29 electrode layers, the stacking process was paused and 3 blank ceramic layers were inserted into the stack followed by three printed layers containing the resin drop which was positioned such that the discharge gap between the electrodes of each layer was in the approximate center of the capacitor. Three blank ceramic layers were then inserted into the capacitor stack followed by the remaining 29 electrode layers and 40 blank ceramic layers. The entire stack was subjected to a lamination pressure sufficient to bond all layers together.

Figure 21:
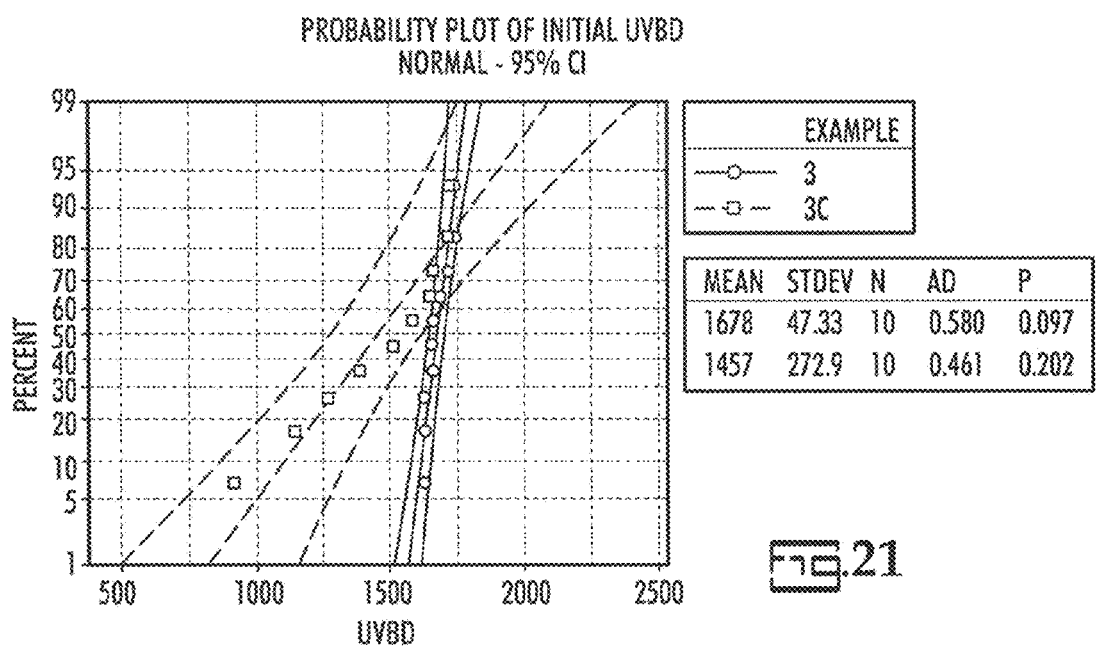
FIG. 21 is a plot illustrating an advantage of the present invention.

The selected capacitors with the internal air filled discharge gap and the control parts were subjected to a voltage ramp of 300 volts/second up to voltage breakdown, followed by a second voltage ramp to breakdown at the same voltage ramp rate. The expected average UVBD for this capacitor design and material set is 95 to 105 volts/micron. As can be seen in Table 1, the average UVBD for the control group is 1678 volts which is in the expected range. Initial average UVBD of the test group 3C was slightly lower at 1457 volts and these distributions are shown in FIG. 21.

Figure 22:
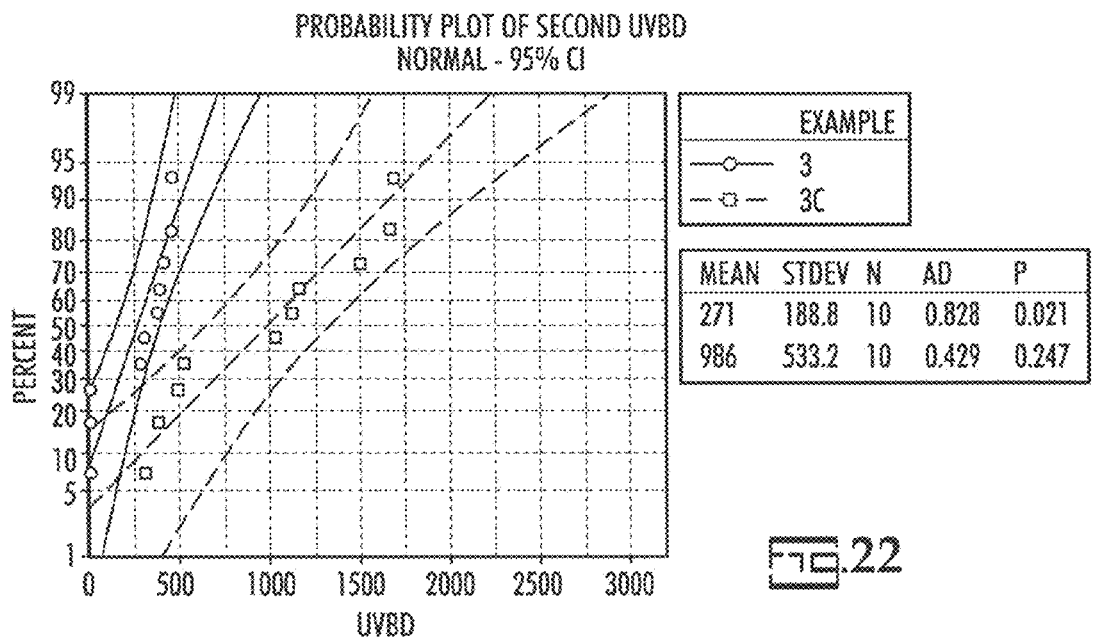
FIG. 22 is a plot illustrating an advantage of the present invention.
Figure 23:
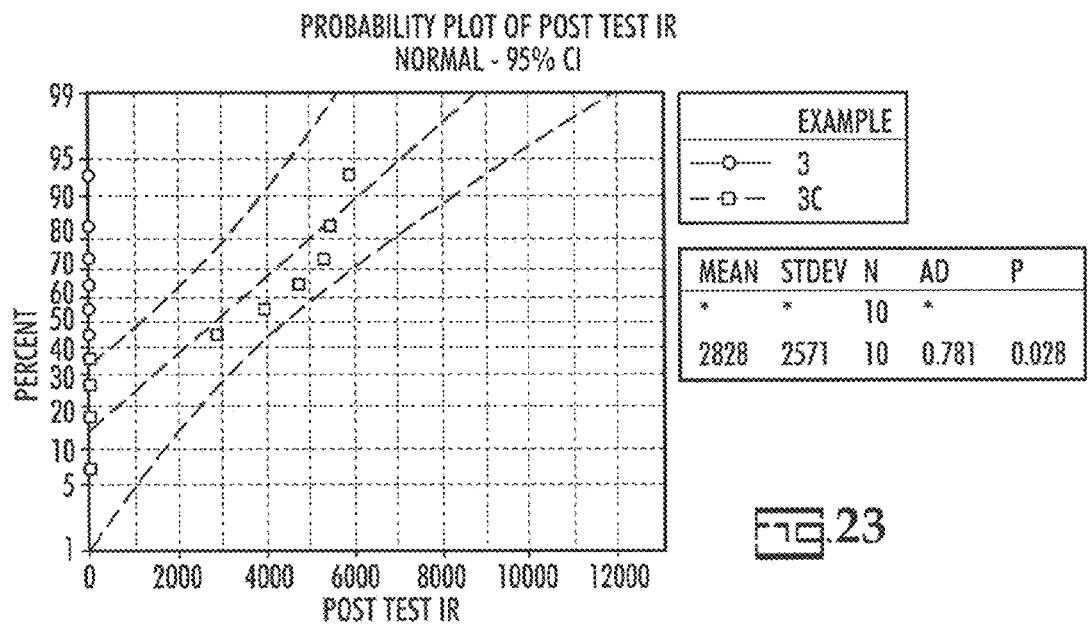
FIG. 23 is a plot illustrating an advantage of the present invention.

The second UVBD distributions are shown in FIG. 22. The average second UVBD for the control group was 271 volts, which was higher than that observed for the second UVBD of the X7R capacitors, Example 2, with similar electrode design as shown in Table 1. However, low post test insulation resistance for the control group, shown in Table 1 and FIG. 23, indicates that the capacitors experienced internal dielectric breakdown. The average second UVBD for the test group was 986 volts, which is significantly higher than the control group. The plot in FIG. 23 shows that six of the ten capacitors tested retained a good insulation resistance, >1G Ohm, and did not suffer internal dielectric breakdown. DPA examination of the internal construction of the test group after the application of UVBD voltage shows no evidence of dielectric breakdown in the area of the air filled discharge gap.

Figure 24:
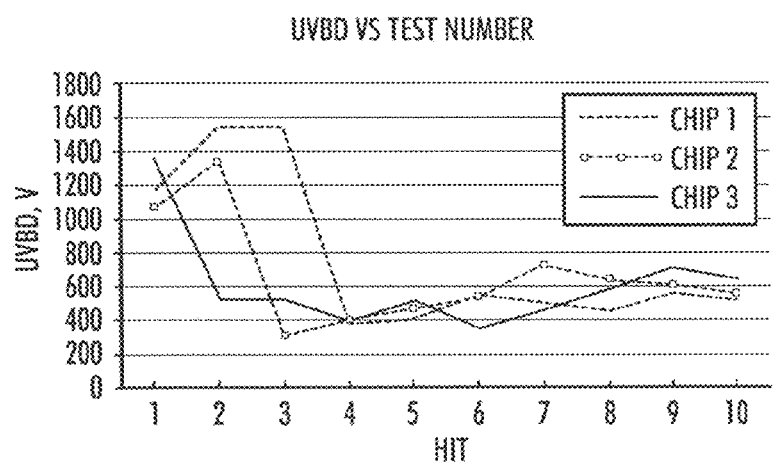
FIG. 24 is a plot illustrating an advantage of the present invention.

Ten capacitors from Example 3C were subjected to repeated cycles of UVBD voltage at a voltage ramp rate of 300 volts/second. Three of the capacitors survived 10 cycles of UVBD. The plot in FIG. 24 shows that after three to four cycles the UVBD voltage settled into a range of 300 to 700 volts and maintained acceptable electrical characteristics as shown in Table 2.

TABLE 2

Characteristics of selected samples from Example 3.

| Chip | Cap, nF | DF, % | IR, Gohm |
|---|---|---|---|
| 1 | 7.8 | .013 | 72 |
| 2 | 7.8 | .011 | 900 |
| 3 | 7.8 | .013 | 4400 |

EXAMPLES 4 & 4D

In Example 4 & 4D a base metal electrode (BME) multi layer ceramic capacitor (MLCC) with C0G class materials in 0805 case size was constructed in the same manner as Examples 3 & 3C so that an air filled discharge gap existed between two internal electrodes of opposite polarity in the case of Example 4D except that the length of the green capacitor was approximately 2.36 mm (0.093 inches) and the width was approximately 1.45 mm (0.057 inches).

The green capacitors were assembled using a dry layer build up process typical in the industry that incorporates screen printed internal electrodes. The electrodes were screen printed in a pattern containing an array of 7000 capacitors, and after the build-up process, singulated into individual green capacitors. The internal electrode was made such that the width of the electrode was approximately 1.04 mm (0.041 inches) and length was 2.06 mm (0.081 inches). The ends of the electrode were tapered, with the taper starting at approximately 0.41 mm (0.016 inches) from the end of the electrode and tapered down to a width of approximately 0.53 mm (0.021 inches). The total green tape thickness for each active layer was 29 microns and for each blank ceramic layer was 4.3 microns. The capacitors contained 30 total internal electrode layers. After stacking 38 blank ceramic layers and 14 electrode layers, the stacking process was paused and 10 blank ceramic layers were inserted into the stack followed by three printed layers containing the resin drop which was positioned such that the discharge gap between the electrodes of each layer was in the approximate center of the capacitor. Ten blank ceramic layers were inserted into the capacitor stack followed by the remaining 13 electrode layers and 38 blank ceramic layers. The entire stack was subjected to a lamination pressure cycle sufficient to bond all layers together.

Figure 25:
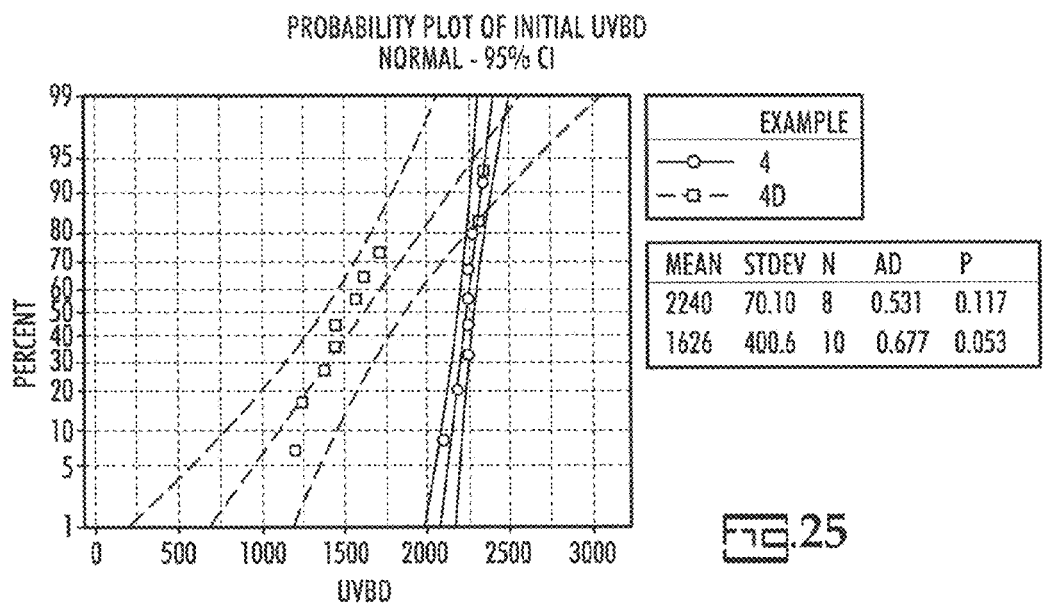
FIG. 25 is a plot illustrating an advantage of the present invention.
Figure 26:
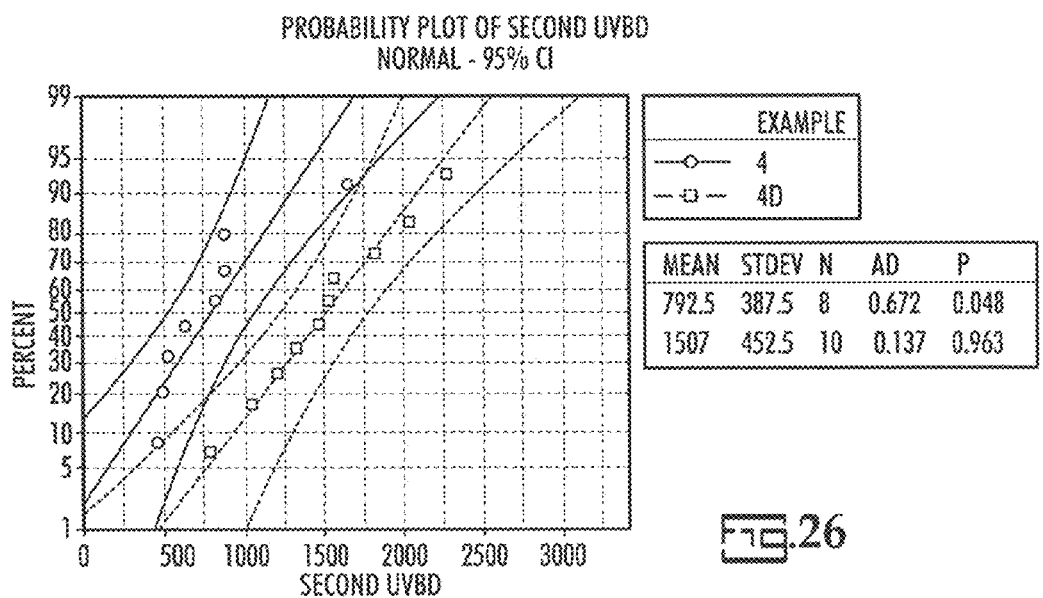
FIG. 26 is a plot illustrating an advantage of the present invention.

The selected capacitors with the internal air filled discharge gap and the control parts were subjected to a voltage ramp of 300 volts/second up to voltage breakdown followed by a second voltage ramp to breakdown at the same voltage ramp rate. The expected average UVBD for this capacitor design and material set was 72 to 80 volts/micron. As can be seen in Table 1, the average UVBD for the control group was 2240 volts which is in the expected range. Initial UVBD of the test group was lower at 1626 volts. The initial UVBD distributions are shown in FIG. 25, the second UVBD distributions in FIG. 26 and the IR associated with these in FIG. 27.

Figure 28:
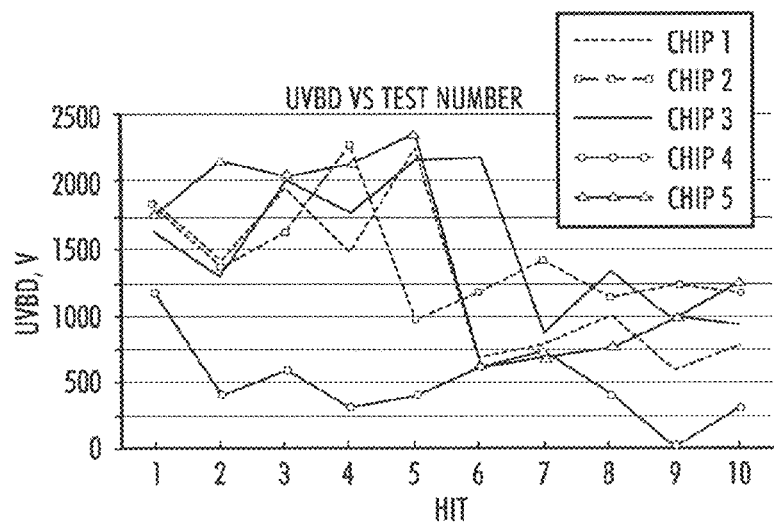
FIG. 28 is a plot illustrating an advantage of the present invention.

The average second UVBD for the control group was 793 volts which is <40% of the initial UVBD. Notably the control group post test insulation resistance was relatively high, averaging 4600 G Ohms. Internal DPA examination of the control group showed that an internal dielectric breakdown had occurred during UVBD, as shown in FIG. 28, but the failure was not catastrophic and appeared to allow the capacitor to accept some charge before arcing across the discharge gap between opposing electrode layers.

Figure 27:
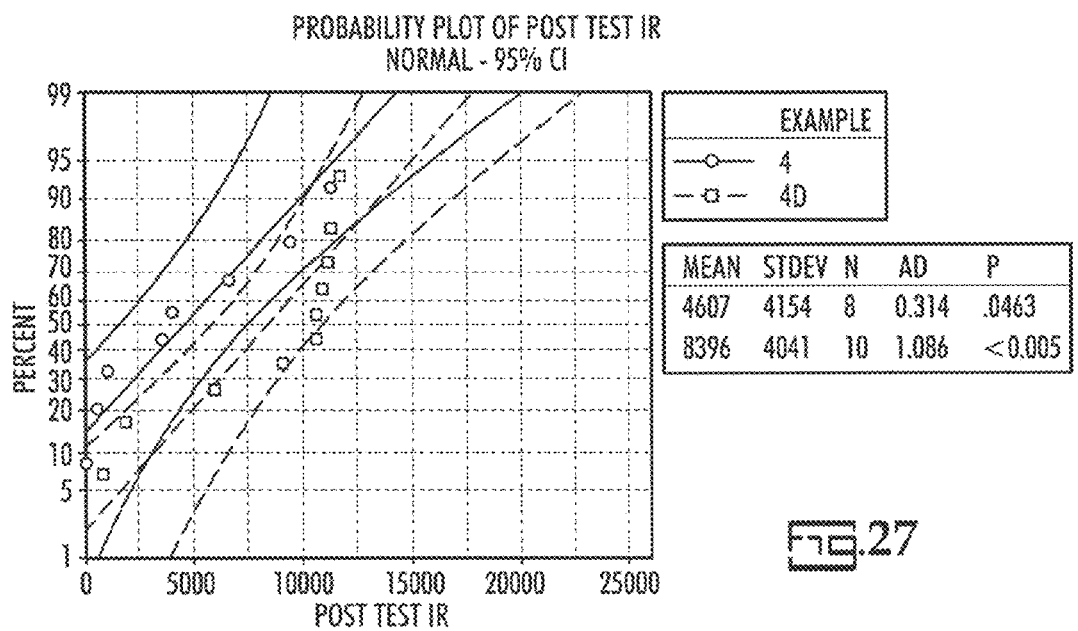
FIG. 27 is a plot illustrating an advantage of the present invention.

The average second UVBD for the test group was 1507 volts, which is similar to the initial UVBD of 1626 volts. The plot in FIG. 27 shows that all ten capacitors tested retained insulation resistance of >1 G Ohm. DPA examination of the internal construction of the test group after the application of UVBD voltage showed no evidence of dielectric breakdown in the area of the air filled discharge gap.

Five capacitors from Example 4D were subjected to repeated cycles of UVBD voltage at a voltage ramp rate of 300 volts/second. Four of the capacitors survived 10 cycles of UVBD. The plot in FIG. 28 showed that after five to seven cycles the UVBD voltage settled into a range of 500 to 140.

EXAMPLES 5 & 5E

In Example 5 & 5E a base metal electrode (BME) multi layer ceramic capacitor (MLCC) with COG class materials in 1206 case size was constructed in the same manner as Example 4 & 4C so that an air filled discharge gap existed between two internal electrodes of opposite polarity for 5E, except that the length of the green capacitor was approximately 3.53 mm (0.151 inches) and the width was approximately 2.05 mm (0.081 inches).

The green capacitors were assembled using a dry layer build up process typical in the industry that incorporated screen printed internal electrodes. The electrodes were screen printed in a pattern containing an array of 3000 capacitors that after the build-up process were singulated into individual green capacitors. The internal electrode was made such that the width of the electrode was approximately 1.55 mm (0.061 inches) and length was 3.53 mm (0.139 inches). The ends of the electrode were tapered, with the taper starting at approximately 0.81 mm (0.032 inches) from the end of the electrode and tapered down to a width of approximately 0.79 (0.031 inches). The total green tape thickness for each active layer was 30 microns and for each blank ceramic layer was 4.3 microns. The capacitors contained 39 total internal electrode layers. After stacking 45 blank ceramic layers and 18 electrode layers, the stacking process was paused and 12 blank ceramic layers were inserted into the stack followed by three printed layers containing the resin drop which was positioned such that the discharge gap between the electrodes of each layer was in the approximate center of the capacitor. Twelve blank ceramic layers were inserted into the capacitor stack followed by the remaining 18 electrode layers and 45 blank ceramic layers. The entire stack was subjected to a lamination pressure cycle sufficient to bond all layers together.

Figure 29:
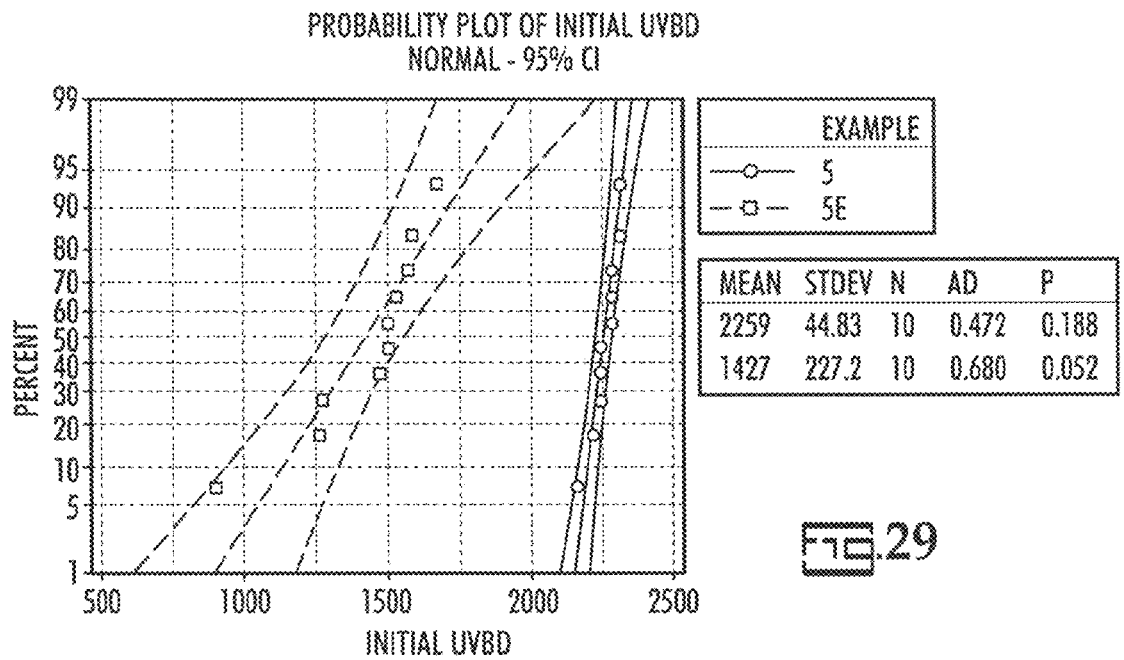
FIG. 29 is a plot illustrating an advantage of the present invention.

The selected capacitors with the internal air discharge gap and the control parts were subjected to a voltage ramp of 300 volts/second up to voltage breakdown, followed by a second voltage ramp to breakdown at the same voltage ramp rate. The expected average UVBD for this capacitor design and material set was 72 to 80 volts/micron. As can be seen in Table 1, the average UVBD for the control group was 2259 volts which is in the expected range. Initial UVBD of the test group was lower at 1427 volts. These distributions are shown in FIG. 29.

Figure 30:
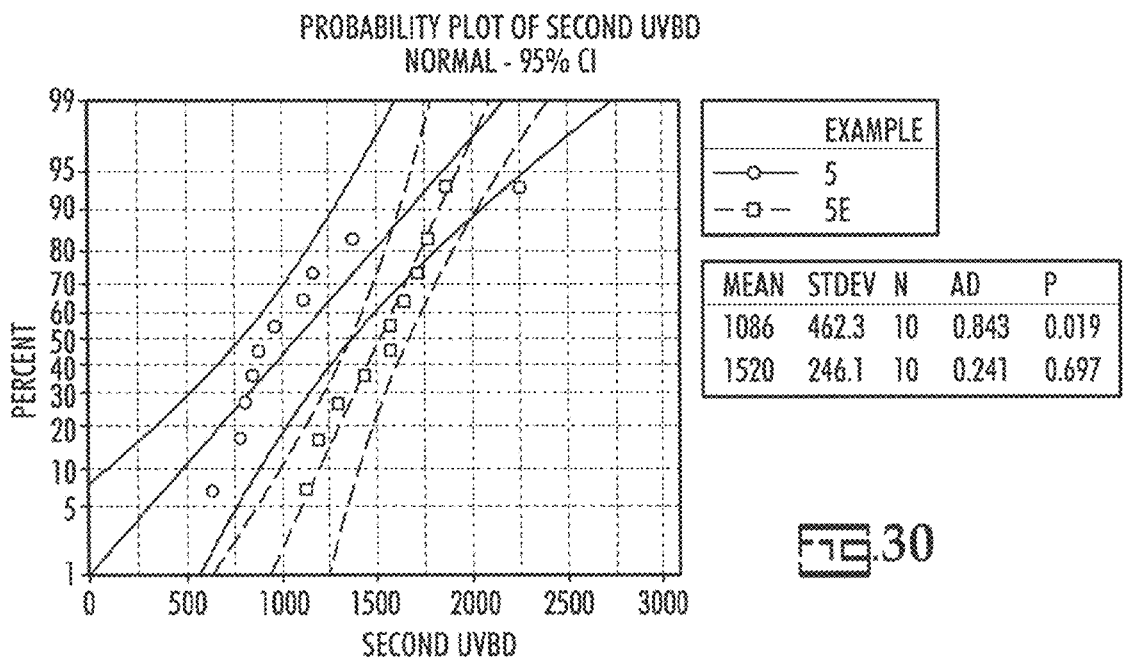
FIG. 30 is a plot illustrating an advantage of the present invention.
Figure 31:
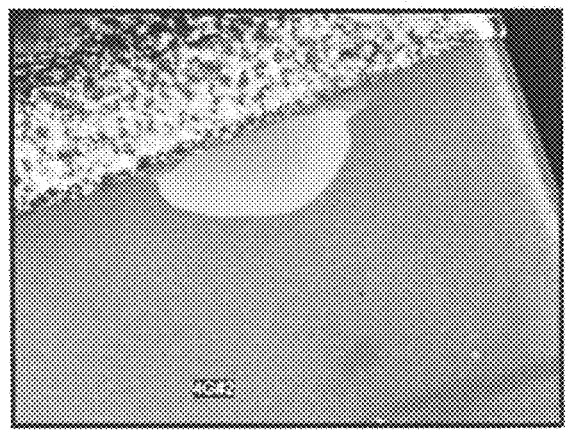
FIG. 31 is cross-sectional view of an embodiment of the invention.
Figure 32:
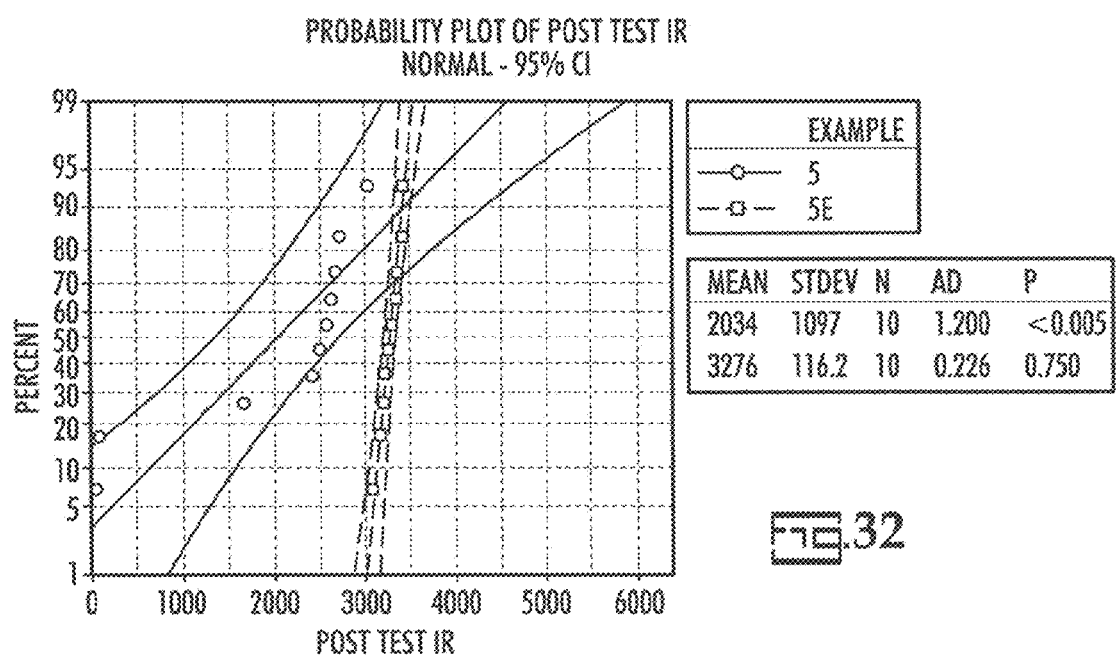
FIG. 32 is a plot illustrating an advantage of the present invention.

The average second UVBD for the control group was 1086 volts which is <50% of the initial UVBD, as seen in Table 1 & FIG. 30. Eight of ten capacitors in the control group exhibit relatively high post test insulation resistance, averaging 2034 Gohms, but an examination revealed evidence of dielectric breakdown as shown in FIG. 31 and 2 capacitors had low IR as shown in FIG. 32.

Figure 33:
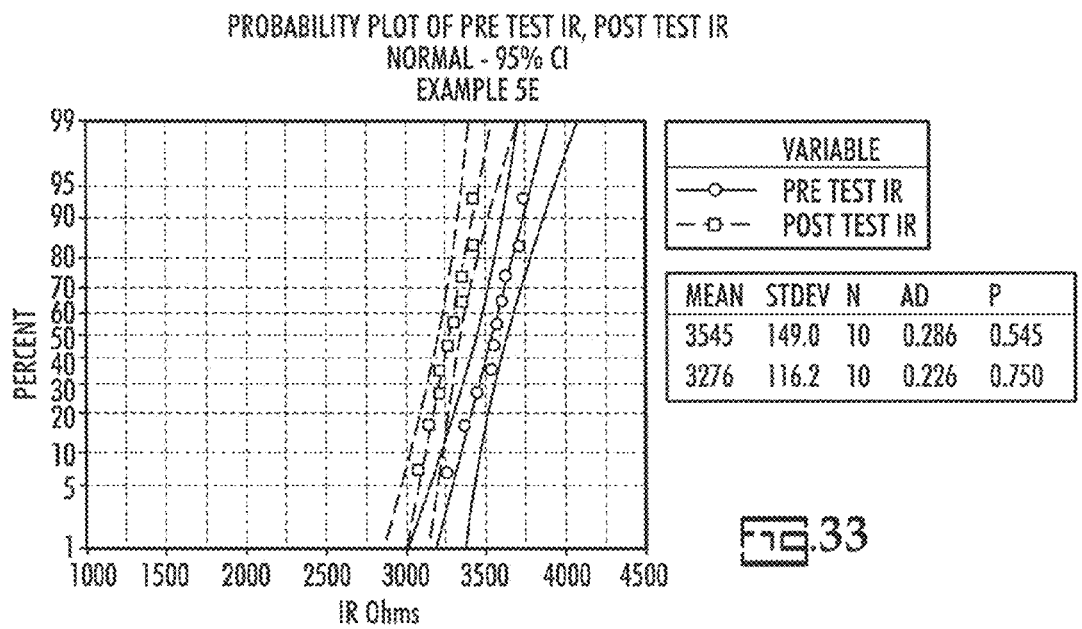
FIG. 33 is a plot illustrating an advantage of the present invention.

The average second UVBD for the test group was 1520 volts, which is similar to the initial UVBD of 1427 volts and the initial and second UVBD of Example 4D. The plot, in FIG. 33, shows that all ten capacitors tested retained good post test insulation resistance which is little changed from the pre test insulation resistance. DPA examination of the internal construction of the test group after the application of UVBD voltage showed no evidence of dielectric breakdown in the area of the air filled discharge gap or in the active region of the capacitor.

Electrostatic Discharge ESD

Figure 34:
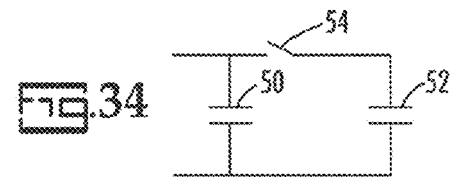
FIG. 34 is a schematic view illustrating ESD testing of a capacitor.

Ceramic capacitors have generally been very robust in withstanding electrostatic discharge voltages and are typically used to shield sensitive components from transient spikes in line voltage. Low capacitance values are preferred in this application to minimize the effects of the capacitor on the circuit. However, low capacitance values typically do not exhibit the highest ESD robustness. This is explained as follows. FIG. 34 shows a schematic that represents the ESD test circuit wherein the source capacitor is 50. An amount of electrical charge from the source capacitor charged to the ESD test voltage is discharged into the test capacitor, 52, when the switch, 54, is closed. Capacitance, dissipation factor and insulation resistance measurements, after the voltage discharge, are measured and compared to initial measures to indicate any degradation in the test capacitor.

In the ideal ESD testing case as charge flows from the source capacitor to the test capacitor, total charge is conserved and the resulting voltage decreases in amount proportional to the total capacitance as described in Equations A, B and C and test examples shown for a source RC network with a 150 pF capacitor and 2 kΩ resistor. This is consistent with the "Human Body Model" testing required for AEC Q200 testing (Ref: ISO10605:2008 & IEC61000-4-2).

$$Q_{initial} = Cap_{source} \times Voltaga_{initial}$$

$$Q_{=150 \text{ pF} \times 8 \text{ kV}} = 1.2 \times 10^{-6} \text{ Coulombs} \qquad \text{Equation A:}$$

$$Q_{final} = Q_{inigial}$$

$$1.2 \times 10^{-6} \text{ Coulombs} = 1.2 \times 10^{-6} \text{ Coulombs} \qquad \text{Equation B:}$$

$$Voltage_{final} = Q/(Cap_{source} + Cap_{cut})$$

$$V = 1.2 \times 10^{-6}/(150 \text{ pF} + 1000 \text{ pF}) \times 10^{-6} = 1043 \text{ V} \qquad \text{Equation C:}$$

If the final voltage exceeds the ultimate voltage breakdown (UVBD) of the capacitor, the capacitor may suffer catastrophic dielectric breakdown and electrical shorts. As these formulas show, lower cap values must withstand higher voltages to dissipate a given amount of charge from the source capacitor. This relationship limits the ability of circuit designers to downsize to smaller capacitors for this application because smaller capacitors have lower cap values at a given voltage ratings.

Figure 35:
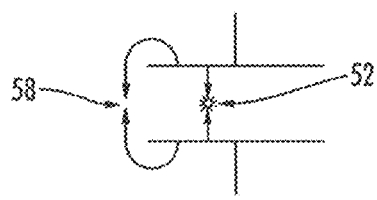
FIG. 35 is a schematic view illustrating breakdown mechanism of a capacitor.

If the UVBD of the capacitor is sufficiently high and the terminal to terminal spacing of the capacitor is small enough, the voltage may discharge across the external surface of the capacitor rather than through the capacitor as a dielectric breakdown. An illustration of these two paths is shown in FIG. 35 where 52 indicates discharge across the internal dielectric, which is destructive, and 58 indicates discharge across the external air filled discharge gap which does not cause destruction. The tendency for a capacitor to arc across the terminals depends on several factors including the shape and position of internal electrodes, the type of dielectric and the environmental conditions. In addition if the circuit containing the capacitor is coated after assembly this can prohibit surface arcing.

Capacitors produced in Example 4 & 4D and Example 5 & 5E were subjected to ESD testing and the results are shown in Table 3. The initial test voltage was 16 kilovolts. If an electrical failure was detected after exposure to the test voltage, the test voltage was reduced to 12 kilovolts and a new sample was tested at the lower voltage. If an electrical failure was not detected, the test voltage was increased to 25 kilovolts and the testing continued. It can be seen in Table 3 that the capacitor test designs containing the internal air filled discharge gap (4D and 5E) can survive higher ESD voltages than the standard capacitor designs (4 and 5) because the internal air filled spark or discharge gap allows the excess voltage to discharge through the capacitor rather than on the exterior surface or by the internal dielectric breakdown mechanism.

TABLE 3

| | ESD Test Results | | | |
| --- | --- | --- | --- | --- |
| | 220 pF | | 750 pF | |
| Voltage | 4D | 4 | 5E | 5 |
| 12 kV | — | — | — | 0/30 |
| 16 kV | 0/5 | 0/5 | 0/5 | 2/5 |
| 25 kV | 0/30 | 1/15 | 0/30 | — |

Figure 35A:
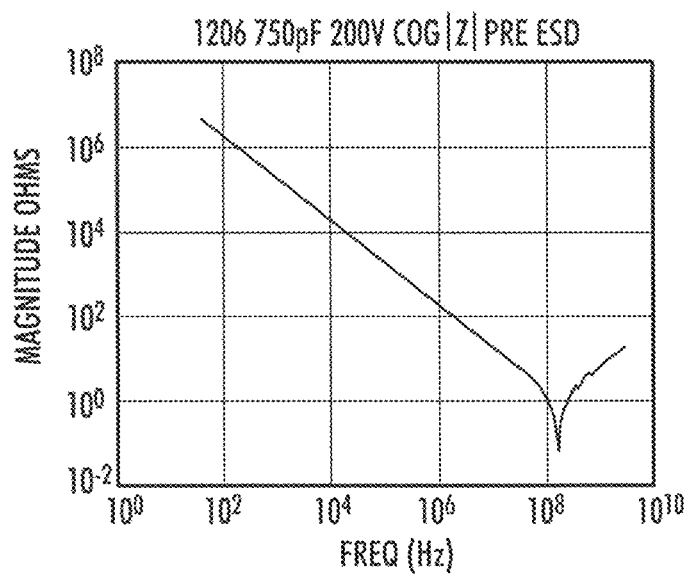
FIG. 35A is a plot illustrating an advantage of the present invention.
Figure 35B:
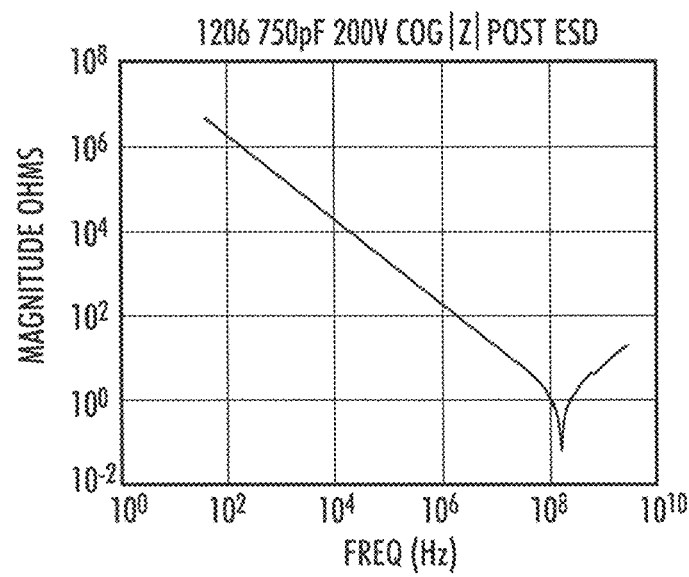
FIG. 35B is a plot illustrating an advantage of the present invention.

Samples 4D and 5E show no significant difference in capacitance, dissipation factor or insulation resistance after ESD testing at 25 kV. In the literature, IEEE Transactions 2009 "Electrostatic Discharge Analysis of Multi Layer Ceramic Capacitors", C Rostamzadeh, H. Dadgostar and F. Canavero, p 35-40 following ESD pulses of +/−15 kV some MLCC were shown to undergo permanent degradation as shown by lower impedance at low frequencies after this test compared to before the test. For this reason the impedance of a few MLCC from sample 5E were measured before and after ESD testing at 25 kV and their average impedances are shown below in FIGS. 35A and 35B respectively. There is no difference in impedance after 25 kV ESD testing in sample 5E, so we can conclude there is no degradation of the capacitors.

The invention has been described with reference to the preferred embodiments without limit thereto. One of skill in the art would realize additional improvements and embodiments which are not specifically described but are within the scope of the invention as set forth in the claims appended hereto.

The invention claimed is:

1. A discharge capacitor comprising:
   first internal electrodes in electrical contact with a first external termination;
   second internal electrodes parallel to and interleaved with said first internal electrodes wherein said second internal electrodes are in electrical contact with a second external termination;
   a dielectric between first internal electrodes and adjacent second internal electrodes;
   a first discharge gap between at least one first internal electrode of said first internal electrodes and said second external termination;
   wherein said discharge gap comprises a material selected from the group consisting of air, nitrogen, hydrogen and an inert gas.

2. The discharge capacitor of claim 1 further comprising first discharge gaps between each first internal electrode of said first internal electrodes and said second external termination.

3. The discharge capacitor of claim 1 further comprising a second discharge gap between at least one second internal electrode of said second internal electrodes and said first external termination.

4. The discharge capacitor of claim 3 further comprising second discharge gaps between each second internal electrode of said second internal electrodes and said first external termination.

5. The discharge capacitor of claim 1 further comprising at least one first shield electrode in electrical contact with said first external termination.

6. The discharge capacitor of claim 5 further comprising at least one second shield electrode wherein said second shield electrode is in electrical contact with said second external termination.

7. The discharge capacitor of claim 6 wherein said first shield electrode and said second shield electrode are coplanar.

8. The discharge capacitor of claim 7 further comprising a shield discharge gap between said first shield electrode and said second shield electrode.

9. The discharge capacitor of claim 1 wherein said discharge gap has a closest separation distance which is less than a closest separation distance between said first termination and said second termination.

10. The discharge capacitor of claim 1 comprising multiple discharge gaps between said first internal electrode and said second internal electrode.

11. The discharge capacitor of claim 1 wherein said first inner electrode and said second internal electrode comprises a material selected from the group consisting of a base metal and a precious metal.

12. The discharge capacitor of claim 1 where said first termination and said second termination comprises a material selected from the group consisting of a base metal and a precious metal.

13. The discharge capacitor of claim 12 wherein at least one of said first termination or said second termination is plated.

14. The discharge capacitor of claim 1 wherein said dielectric comprises barium titanate or calcium zirconate and at least one of said first internal electrode or said second internal electrode comprises a base metal.

15. An electronic device comprising the discharge capacitor of claim 1.

16. The electronic device of claim 15 wherein said electronic device is a filter.

17. The electronic device of claim 15 wherein said electronic device further comprises an inductor.

18. The electronic device of claim 17 wherein said inductor and said discharge capacitor are in electrical parallel.

19. The electronic device of claim 15 wherein said discharge capacitor is selected from an X-discharge capacitor and a Y-discharge capacitor.

20. A discharge capacitor comprising:
first internal electrodes in electrical contact with a first external termination;
second internal electrodes parallel to and interleaved with said first internal electrodes wherein said second internal electrodes are in electrical contact with a second external termination;
a dielectric between first internal electrodes and adjacent second internal electrodes;
a first shield electrode in electrical contact with said first external termination;
a second shield electrode coplanar with said first shield electrode and in electrical contact with said second external termination; and
a shield discharge gap between said first shield electrode and said second shield electrode;
wherein said discharge gap comprises a material selected from the group consisting of air, nitrogen, hydrogen and an inert gas.

21. The discharge capacitor of claim 20 further comprising at least one first discharge gap between a first internal electrode of said first internal electrodes and said second external termination.

22. The discharge capacitor of claim 21 further comprising at least one second discharge gap between a second internal electrode of said second internal electrodes and said first external termination.

23. The discharge capacitor of claim 20 wherein said discharge gap has a closest separation distance which is less than a closest separation distance between said first termination and said second termination.

24. The discharge capacitor of claim 20 comprising multiple discharge gaps between said first internal electrode and said second internal electrode.

25. The discharge capacitor of claim 20 where said first inner electrode and said second internal electrode comprises a material selected from the group consisting of a base metal and a precious metal.

26. The discharge capacitor of claim 20 where said first termination and said second termination comprises a material selected from the group consisting of a base metal and a precious metal.

27. The discharge capacitor of claim 26 wherein at least one of said first termination or said second termination is plated.

28. The discharge capacitor of claim 20 wherein said dielectric comprises barium titanate or calcium zirconate and at least one of said first internal electrode or said second internal electrode comprises a base metal.

29. An electronic device comprising the discharge capacitor of claim 1.

30. The electronic device of claim 29 wherein said electronic device is a filter.

31. The electronic device of claim 29 wherein said electronic device further comprises an inductor.

32. The electronic device of claim 31 wherein said inductor and said discharge capacitor are electrically connected by at least one terminal.

33. The electronic device of claim 29 wherein said discharge capacitor is selected from an X-discharge capacitor and a Y-discharge capacitor.

34. A discharge capacitor comprising:
first internal electrodes in electrical contact with a first external termination;
second internal electrodes in electrical contact with a second external termination wherein each first internal electrode of said internal electrodes is in a common plane with one second internal electrode of said second internal electrodes;
at least one first discharge gap between at least one first internal electrode of said first internal electrodes and a coplanar second internal electrode of said second internal electrodes; and
at least one floating electrode between adjacent common planes;
wherein said discharge gap comprises a material selected from the group consisting of air, nitrogen, hydrogen and an inert gas.

35. The discharge capacitor of claim 34 further comprising at least one first shield electrode in electrical contact with said first external termination.

36. The discharge capacitor of claim 35 further comprising at least one second shield electrode in electrical contact with said second external termination.

37. The discharge capacitor of claim 34 comprising multiple discharge gaps between said first internal electrode and said second internal electrode.

38. The discharge capacitor of claim 34 where said first inner electrode and said second internal electrode comprises a material selected from the group consisting of a base metal and a precious metal.

39. The discharge capacitor of claim 34 where said first termination and said second termination comprises a material selected from the group consisting of a base metal and a precious metal.

40. The discharge capacitor of claim 39 wherein at least one of said first termination or said second termination is plated.

41. The discharge capacitor of claim 34 wherein said dielectric comprises barium titanate or calcium zirconate and at least one of said first internal electrode or said second internal electrode comprises a base metal.

42. An electronic device comprising the discharge capacitor of claim 1.

43. The electronic device of claim 42 wherein said electronic device is a filter.

44. The electronic device of claim 42 wherein said electronic device further comprises an inductor.

45. The electronic device of claim 44 wherein said inductor and said discharge capacitor are electrically connected by at least one terminal.

46. The electronic device of claim 42 wherein said discharge capacitor is selected from an X-discharge capacitor and a Y-discharge capacitor.

47. An electronic filter comprising:
a circuit comprising at least two traces;
a discharge capacitor comprising:
first internal electrodes in electrical contact with a first external termination;
second internal electrodes parallel to and interleaved with said first internal electrodes wherein said second internal electrodes are in electrical contact with a second external termination;
a dielectric between first internal electrodes and adjacent second internal electrodes;
a first discharge gap between at least one first internal electrode of said first internal electrodes and said second external termination;
wherein said first termination is in electrical contact with a first trace of said two traces; and
said second termination is in electrical contact with a second trace of said two traces;
wherein said discharge gap comprises a material selected from the group consisting of air, nitrogen, hydrogen and an inert gas.

48. The electronic filter of claim 47 wherein said first trace is in electrical contact with electric ground.

49. The electronic filter of claim 47 wherein said discharge gap has a closest separation distance which is less than a closest separation distance between said first termination and said second termination.

50. The electronic device of claim 47 further comprising multiple discharge gaps between said first internal electrode and said second internal electrode.

51. The electronic device of claim 47 where said first inner electrode and said second internal electrode comprises a material selected from the group consisting of a base metal and a precious metal.

52. The electronic device of claim 47 where said first termination and said second termination comprises a material selected from the group consisting of a base metal and a precious metal.

53. The electronic device of claim 52 wherein at least one of said first termination or said second termination is plated.

54. The electronic device of claim 47 wherein said dielectric comprises barium titanate or calcium zirconate and at least one of said first internal electrode or said second internal electrode comprises a base metal.

55. The electronic device of claim 47 further comprising first discharge gaps between each first internal electrode of said first internal electrodes and said second external termination.

56. The electronic device of claim 47 further comprising a second discharge gap between at least one second internal electrode of said second internal electrodes and said first external termination.

57. The electronic device of claim 56 further comprising second discharge gaps between each second internal electrode of said second internal electrodes and said first external termination.

58. The electronic device of claim 47 further comprising at least one first shield electrode in electrical contact with said first external termination.

59. The electronic device of claim 58 further comprising at least one second shield electrode wherein said second shield electrode is in electrical contact with said second external termination.

60. The electronic device of claim 59 wherein said first shield electrode and said second shield electrode are coplanar.

61. The electronic device of claim 60 further comprising a shield discharge gap between said first shield electrode and said second shield electrode.

62. The electronic device of claim 47 wherein said filter further comprises an inductor.

63. The electronic device of claim 62 wherein said inductor and said discharge capacitor are electrically connected by at least one terminal.

64. The electronic device of claim 47 wherein said discharge capacitor is selected from an X-discharge capacitor and a Y-discharge capacitor.

* * * * *